(12) United States Patent  
Kim

(10) Patent No.: US 9,899,096 B2  
(45) Date of Patent: Feb. 20, 2018

(54) NAND FLASH MEMORY HAVING MULTIPLE CELL SUBSTRATES

(71) Applicant: Conversant Intellectual Property Management Inc., Ottawa (CA)

(72) Inventor: Jin-Ki Kim, Ottawa (CA)

(73) Assignee: Conversant Intellectual Property Management Inc., Ottawa (CA)

( * ) Notice: Subject to any disclaimer, the term of this patent is extended or adjusted under 35 U.S.C. 154(b) by 0 days.

(21) Appl. No.: 15/411,138

(22) Filed: Jan. 20, 2017

(65) Prior Publication Data

US 2017/0229188 A1 Aug. 10, 2017

Related U.S. Application Data

(63) Continuation of application No. 14/753,500, filed on Jun. 29, 2015, now Pat. No. 9,583,204, which is a continuation of application No. 14/032,816, filed on Sep. 20, 2013, now Pat. No. 9,070,461, which is a continuation of application No. 13/073,150, filed on Mar. 28, 2011, now Pat. No. 8,582,372, which is a continuation of application No. 12/143,285, filed on Jun. 20, 2008, now Pat. No. 7,940,572.

(60) Provisional application No. 61/019,415, filed on Jan. 7, 2008.

(51) Int. Cl.
| | |
|---|---|
| *G11C 11/34* | (2006.01) |
| *G11C 16/34* | (2006.01) |
| *G11C 16/04* | (2006.01) |
| *G11C 16/16* | (2006.01) |
| *G11C 16/26* | (2006.01) |

(52) U.S. Cl.
CPC ...... *G11C 16/3427* (2013.01); *G11C 16/0483* (2013.01); *G11C 16/16* (2013.01); *G11C 16/26* (2013.01)

(58) Field of Classification Search
CPC ...... G11C 16/16; G11C 16/14; G11C 16/3445
USPC ............ 365/185.29, 185.18, 230.03, 185.11
See application file for complete search history.

(56) References Cited

U.S. PATENT DOCUMENTS

| | | | | |
|---|---|---|---|---|
| 5,963,476 A | * | 10/1999 | Hung ................. | G11C 16/0416 257/E27.103 |
| 2005/0286301 A1 | * | 12/2005 | Mochizuki ............. | G11C 29/02 365/185.17 |

\* cited by examiner

*Primary Examiner* — Son Dinh  
(74) *Attorney, Agent, or Firm* — Borden Ladner Gervais

(57) ABSTRACT

A NAND flash memory bank having a plurality of bitlines of a memory array connected to a page buffer, where NAND cell strings connected to the same bitline are formed in at least two well sectors. At least one well sector can be selectively coupled to an erase voltage during an erase operation, such that unselected well sectors are inhibited from receiving the erase voltage. When the area of the well sectors decrease, a corresponding decrease in the capacitance of each well sector results. Accordingly, higher speed erasing of the NAND flash memory cells relative to a single well memory bank is obtained when the charge pump circuit drive capacity remains unchanged. Alternately, a constant erase speed corresponding to a single well memory bank is obtained by matching a well segment having a specific area to a charge pump with reduced drive capacity. A reduced drive capacity charge pump will occupy less semiconductor chip area, thereby reducing cost.

8 Claims, 17 Drawing Sheets

NAND FLASH MEMORY HAVING MULTIPLE CELL SUBSTRATES

CROSS REFERENCE TO RELATED APPLICATIONS

This application is a continuation of U.S. application Ser. No. 14/753,500, filed on Jun. 29, 2015, which is a continuation of U.S. application Ser. No. 14/032,816, filed on Sep. 20, 2013, now issued as U.S. Pat. No. 9,070,461 on Jun. 30, 2015, which is a continuation of U.S. application Ser. No. 13/073,150, filed on Mar. 28, 2011, now issued as U.S. Pat. No. 8,582,372 on Nov. 12, 2013 which is a continuation of U.S. application Ser. No. 12/143,285, filed on Jun. 20, 2008, now issued as U.S. Pat. No. 7,940,572 on May 10, 2011, which claims the benefit of priority of U.S. Provisional Patent Application No. 61/019,415 filed on Jan. 7, 2008, which are hereby incorporated by reference.

TECHNICAL FIELD

The present invention relates generally to NAND flash memory. More particularly, the present invention relates to erasing NAND flash memory cells.

BACKGROUND

Flash memory is a commonly used type of non-volatile memory in widespread use as storage for consumer electronics and mass storage applications. Flash memory is pervasive in popular consumer products such as digital audio/video players, cell phones and digital cameras, for storing application data and/or media data. Flash memory can further be used as a dedicated storage device, such as a portable flash drive pluggable into a universal serial port (USB) of a personal computer, and a magnetic hard disk drive (HDD) replacement for example. It is well known that flash memory is non-volatile, meaning that it retains stored data in the absence of power, which provides a power savings advantage for the above mentioned consumer products. Flash memory is suited for such applications due to its relatively high density for a given area of its memory array.

FIG. 1A is a general block diagram of typical flash memory device. Flash memory 2 includes well known input and output buffer circuits, such as input/output (I/O) buffer block 3a and control buffer block 3b for receiving external control and data input signals and providing data output signals. The control buffer block 3b receiving the control signals, such as CE# and WE#, may include other basic logic circuits, for implementing rudimentary functions that may be related to control of the data input and buffers for example. Flash memory 2 includes control circuit 3c, for controlling various high level functions of the flash circuits such as read, program and erase operations for example, an address register 4 for storing address information, a data register 5 for storing program data information, a command register 6 for storing command data information, high voltage circuits for generating the required program and erase voltages, and core memory circuits for accessing the memory array 7. Memory array 7 includes flash memory cells, arranged as NAND cell strings for example. The NAND cell strings of a column are coupled to a bitline, which is connected to a page buffer/sense amplifier circuit 8. Sense amplifier circuit 8 senses read data from a selected page of memory cells and provides program data to a selected page of memory cells. One page of memory cells refers to all the memory cells connected to the same wordline. Driving the wordlines is row drivers/decoders, shown as a row address decoder 9a and row address buffer 9b. There can be one or more stages of decoding, and row address buffer 9b can include block decoding logic.

The control circuit 3c includes a command decoder and logic for executing internal flash operations, such as read, program and erase functions. Those skilled in the art will understand that these operations are executed in response to the command data stored in the command register 6, sometimes in combination with the address data and program data stored in the respective address register 4 and data register 5, depending on the operation to be executed. The command data, address data and program data are issued by a memory controller and latched into the corresponding registers by flash memory 2. The functions of the shown circuit blocks of flash memory 2 are well known in the art. Persons skilled in the art will understand that flash memory 2 shown in FIG. 1A represents one possible flash memory configuration amongst many possible configurations. In FIG. 1A, memory array 7, sense amplifier circuit 8, data register 5, row address decoder 9a and row address buffer 9b are part of one memory bank.

FIG. 1B is a floor plan layout a prior art flash memory device to show the area occupied by various circuit blocks. Typically, all the circuit blocks shown in FIG. 1A are formed in the floor plan layout of FIG. 1B. In FIG. 1B, flash memory chip 10 is a semiconductor material rectangular in shape, upon which are formed transistor circuits and structures. Occupying a large proportion of the area are two memory arrays or memory tiles, 12 and 14, which generally correspond to memory array 7 of FIG. 1A. While the present example flash memory 10 includes two memory arrays, alternative designs can include a single memory array or more than two memory arrays. Located between memory arrays 12 and 14 are row decoders 16 that drive wordlines to the required voltage level for read, program and erase operations. Row decoders 16 generally correspond to row address decoder 9a and row address buffer 9b of FIG. 1A. In the example of FIG. 1B, wordlines (not shown) extend in a horizontal direction. Located below each of memory arrays 12 and 14 are page buffers 18 and 20, each being electrically connected to bitlines (not shown) for providing program data and for sensing read data. Page buffers 18 and 20 generally correspond to data register 5 and sense amplifier 8 of FIG. 1A. The combination of memory array 12, row decoders 16 and page buffer 18 is referred to as a memory bank or plane. Similarly, the combination of memory array 14, row decoders 16 and pager buffer 20 is referred to as another memory bank or plane. The page buffers 18 and 20 receive and provide data via data lines (not shown), which are coupled to the input and output (I/O) circuits in logic block 22. Logic block 22 further includes other circuits such as a command decoder and registers. Another large area is dedicated for a charge pump 24, which is responsible for generating high voltages required for programming and erasing data stored in the flash memory cells of the first memory array 12 and the second memory array 14. Charge pump 24 generally corresponds to the high voltage generator of FIG. 1A. The elements of flash memory chip 10 have been generically described, but persons skilled in the art will understand that each of the outlined blocks of FIG. 1B will include all the circuits necessary to achieve proper operation of flash memory chip 10.

In the presently shown example of FIG. 1B, the flash memory chip 10 is designed to have NAND flash memory cells arranged in NAND cell strings within memory arrays 12 and 14. The NAND cell strings are organized into memory blocks, such as Block[1] to Block[n], where n can be any non-zero integer value. The selection of the number of blocks in each array is a design parameter of flash memory chip 10.

FIG. 2 depicts an example memory array of flash memory chip 10 of FIG. 1B. The example illustrated in FIG. 2 has two memory blocks in one memory array. In FIG. 2, one NAND cell string is outlined with a dashed box 30, which includes a string select device 32, flash memory cells 34, and a sourceline select device 36 connected in series between bitline BL1 and common source line CSL. There can be "i" flash memory cells 34 per NAND cell string, where i is a non-zero integer value. Accordingly, wordlines WL1 to WLi are electrically coupled to corresponding gates of the flash memory cells 34. A string select line (SSL) and a source select line (GSL) are electrically coupled to select devices 32 and 36 respectively. In the present example, all the transistors of the NAND cell string 30 are n-channel devices.

A memory block 38, being the same as memory Block[1] of FIG. 1B for example, will include all the NAND cell strings having select devices and flash memory cells connected to the same wordlines, string select line and source select line. The width of memory block 38 is set by the number of bitlines, which in the case of FIG. 2 is "j" bitlines where j is a non-zero integer value. Memory block 40 includes further NAND cell strings connected to bitlines BL1 to BLj. A bitline and the NAND cell strings electrically connected to it is referred to as a column.

All the circuits of flash memory chip 10 of FIG. 1B, including the NAND cell strings shown in FIG. 2 are formed by using well-known semiconductor manufacturing processes. In such processes, transistors of the same type are grouped together and formed in their own well. For example, n-type transistors are formed in a p-type well and p-type transistors are formed in an n-type well. In some cases, only a single well is used, where its type depends on the type of the substrate. In most NAND flash memory devices, all the NAND cell strings in a memory array are formed in one well, which results in disadvantages that are described later on.

FIG. 3 is a cross-sectional diagram of memory array 14 taken along line A-A' of FIG. 1B, and angled to show specific features on its surface. The cross-sectional structure of the semiconductor substrate where page buffer 20 and logic block 22 are formed is not shown. In FIG. 3, the substrate 50 is a p-type substrate having an n-well 52 and a p-well 54. P-well 54 is formed within n-well 52 such that p-well 54 is spaced from substrate 50. All the NAND cell strings 30 of FIG. 2, and more specifically the transistor devices of NAND cell strings 30, are formed within p-well 54. The well structure shown in FIG. 3 is commonly known as a triple-well structure, or a triple pocket structure. On the surface of p-well 54 are the NAND cell strings 30, simply represented as trapezoid boxes, where each NAND cell string of a column is connected in parallel to a bitline, such as bitline BLk where "k" is a variable representing a logical bitline position less than BLj. With reference to FIG. 2, the bitline is connected to the string select device 32 of each NAND cell string 30. Accordingly, the NAND cell strings that share common select lines and wordlines are part of one memory block. FIG. 3 illustrates four memory blocks 56, 58, 60 and 62 to simply the drawing, however those skilled in the art will understand that there can be any number of memory blocks in memory arrays 12 and 14. Both the n-well 52 and the p-well 54 receives an erase voltage Verase during erase operations, and are both biased to 0V or VSS during all other operations such as program and read for example. Verase can be coupled to n-well 52 and p-well 54 at multiple different locations.

FIG. 4 is a cross section diagram of a NAND cell string 30 of FIG. 3, having the equivalent circuit diagram shown in FIG. 2. Each flash memory cell includes a polysilicon wordline 70 and a polysilicon floating gate 72, where the floating gate 72 is formed over a thin gate oxide 74. On either side of thin gate oxide 74 and formed within p-type well 54 are n-type diffusion regions 76. The sourceline select device 36 includes a polysilicon gate 78 formed over a thick gate oxide 80, and an n-type diffusion region 82 acting as the common source line CSL. Diffusion region 82 is shared with all the NAND cell strings in the memory block, as illustrated in FIG. 2. The string select device 32 includes a polysilicon gate 84 formed over a thick gate oxide 86, and an n-type diffusion region 88 that is electrically connected to a bitline 90.

As is well known in the art, NAND flash memory devices are block erasable, meaning that individual memory blocks can be selectively erased through Fowler-Nordheim (F-N) tunneling, based on a block address or other selection signal. In order to erase a memory block such as memory block 38 of FIG. 2, the wordlines of the selected memory block are biased to 0V, SSL and GSL are floated, and both the n-well 52 and the p-well 54 are biased to Verase. Verase is a high voltage generated by the charge pump 24 of FIG. 1B, and in example flash memory devices is about 20V. Because SSL and GSL are floated during the erase operation, both SSL and GSL are self-boosted when Verase is applied to n-well 52 and p-well 54 due to the capacitive coupling between the wells and SSL and GSL. Depending on the capacitive coupling ratio, GSL and SSL can be boosted to approximately 80% to 90% of Verase. CSL and all bitlines are floated during the erase operation, and eventually self-boost to about Verase-0.6V. Those skilled in the art will understand that the forward bias p-n junction voltage drop across p-well 54 to the n-type diffusion regions 82 and 88. Under these erase bias conditions, trapped electrons (charge) in the floating gate of the flash memory cells are emitted uniformly to the substrate. The threshold voltage (Vth) of the erased flash memory cell becomes negative, meaning that the erased cell will turn on with a gate bias of 0V.

Since the unselected memory blocks reside in the same p-well 54 as the selected memory block, these unselected memory blocks must be inhibited from being erased. A self-boosting erase inhibit scheme described in U.S. Pat. No. 5,473,563 is widely used in NAND flash memory devices to prevent erasure of unselected memory blocks. To prevent erasure of flash memory cells in unselected memory blocks using the self-boosting erase inhibit scheme, all wordlines in unselected memory blocks are floated. Therefore floated wordlines in the unselected memory blocks are boosted to about 90% of Verase when the p-well 54 rises to Verase, by capacitive coupling between the p-well 54 and the wordlines. It should be understood that the final boosted voltage level on the floating wordlines is determined by the coupling ratio between the substrate and wordlines. The boosted voltage of the wordlines in the unselected memory blocks is effective for reducing the electric field between the p-well 54 and the wordlines, thereby minimizing unintended erasure of data stored therein.

Once the erase operation ends, Verase is set to VSS for a block erase verify operation for determining if all the flash memory cells of the selected memory block have been successfully erased. If not, then a subsequent erase operation is executed upon the selected memory block. Verase is also set to VSS during read and program operations, or alternately, a different circuit couples VSS to n-well 52 and p-well 54. For example, n-channel transistor devices can be used to couple n-well 52 and p-well 54 in response to a control signal that is activated during read or program operations. Logic for executing such an operation would be well known to those skilled in the art. A problem with the prior art NAND flash memory is the amount of time required to drive n-well 52 and p-well 54 from VSS to Verase, which directly affects the total erase time. It is apparent from FIG. 1B that the area of one memory bank is large relative to the total area of flash memory chip 10, and thus the capacitance can be in the range of several nF for example. As a result, the rise time of Verase can be between 200 µs to 300 µs, for example.

FIG. 5 is a graph plotting the relationship between the substrate voltage Vsub and time. If an erase operation begins at time=0 and Verase is at VSS, then there is a delay of t_delay before the substrate voltage reaches Verase. As previously mentioned, this delay can range between 200 µs to 300 µs for some example flash memory devices. A solution to improve erase performance is to increase the size of the charge pump circuit that generates Verase. This typically involves a combination of adding capacitor elements or increasing the size of capacitor elements of the charge pump to increase the rate at which the substrate reaches Verase. A larger charge pump would thus reduce t_delay and improve erase performance. Persons skilled in the art understand that capacitor elements used in such charge pumps occupy significant semiconductor area. FIG. 1B clearly shows that charge pump 24 occupies a significant area of flash memory chip 10, especially in comparison with the logic block 22. An example charge pump circuit is shown in U.S. Pat. No. 5,642,309. In view of the tightly packed layout of the example flash memory chip 10 of FIG. 1B, there is insufficient area for increasing the size of charge pump 24. Accordingly, improved erase performance in flash memory chip 10 may not be attained. In some flash memory chip designs, the primary constraint may be to minimize chip size, which directly impacts the cost of the chip. While a minimally sized charge pump will reduce chip area consumption, the drawback is degraded erase performance. Hence there is a trade-off between erase performance and chip area in prior art flash memory chips.

Another problem with the prior art NAND flash memory is the power consumption due to the charging and discharging of the n-well 52 and p-well 54. As previously mentioned, because each of the memory array wells occupy a large proportion of the area of flash memory chip 10 of FIG. 1B, their capacitance can be in the range of several nF for example. This is problematic because after each erase cycle, an erase verify operation is executed to check that the erased memory cells have the erased threshold voltage. An erase verify operation is similar to a normal NAND flash read operation, and therefore the n-well 52 and p-well 54 are biased to VSS. If the verify operation fails, then the erase cycle is repeated and the wells are charged back to Verase. This process may repeat several times, thus consuming power.

A further problem with the prior art NAND flash memory is the exposure of unselected memory blocks to the Verase well voltage when a selected memory block is to be erased. Although the previously described self-boosting erase inhibit scheme can be used to minimize erase disturbance in the cells of the unselected memory blocks, there is still a voltage difference between Verase of the well and the wordlines that are at about 80% to 90% of Verase in the unselected blocks. While the resulting erase disturb may be small for one erase cycle, the cumulative effect will be significant. For example, if it is assumed that the memory array has 2048 memory blocks and the erase time for one memory block is about 2 ms, then erasing all the memory blocks just once will expose each memory block to 2047×2 ms of erase stress. The cumulative erase disturb stress is more significant in multi-level NAND flash cells.

SUMMARY

It is an object of the present invention to obviate or mitigate at least one disadvantage of previous NAND Flash memories.

According to an embodiment of the present invention achieves a NAND flash memory chip having high speed erase performance while minimizing charge pump circuit area, power consumption and erase stress for unselected memory blocks.

For example, in accordance with one embodiment, there is provided with a NAND flash memory bank having a plurality of bitlines of a memory array connected to a page buffer, where NAND cell strings connected to the same bitline are formed in at least two well sectors. At least one well sector can be selectively coupled to an erase voltage during an erase operation, such that unselected well sectors are inhibited from receiving the erase voltage. When the area of the well sectors decrease, a corresponding decrease in the capacitance of each well sector results. Accordingly, higher speed erasing of the NAND flash memory cells relative to a single well memory bank is obtained when the charge pump circuit drive capacity remains unchanged. Alternately, a constant erase speed corresponding to the single well memory bank is obtained by matching a well segment having a specific area to a charge pump with reduced drive capacity. A reduced drive capacity charge pump will occupy less semiconductor chip area. Furthermore, because the well sector capacitance is reduced, the amount of power consumed for charging and discharging the well sector during erase operations is also reduced.

In a first aspect, the present invention provides NAND Flash memory. The NAND flash memory includes a first well sector, a second well sector, a bitline and a page buffer. The first well sector has a first NAND cell string for selectively receiving an erase voltage during an erase operation. The second well sector has a second NAND cell string for selectively receiving the erase voltage during the erase operation. The bitline is electrically connected to the first NAND cell string and the second NAND cell string. The page buffer is electrically connected to the bitline. The first well sector can include a third NAND cell string electrically connected to a second bitline, and the second well sector can include a fourth NAND cell string electrically connected to the second bitline, where the second bitline is electrically connected to the page buffer. The first NAND cell string and the third NAND cell string are part of one memory block, and the second NAND cell string and the fourth NAND cell string are part of another memory block.

Alternately, the first well sector can include a third NAND cell string electrically connected to the bitline, and the second well sector can include a fourth NAND cell string electrically connected to the bitline. The first NAND cell string is part of a first memory block, the third NAND cell string is part of a second memory block, the second NAND cell string is part of a third memory block, and the fourth NAND cell string is part of a fourth memory block. The NAND flash memory can further include a block decoder for selecting one of the first memory block, the second memory block, the third memory block and the fourth memory block for erasure, in response to a block address. A charge pump and a selector can be provided, where the charge pump provides an erase voltage and the selector couples the erase voltage to one of the first well sector and the second well sector in response to the block address.

The bitline described in the first aspect can include a first bitline segment electrically connected to the first NAND cell string and a second bitline segment electrically connected to the second NAND cell string through an isolation device, where the isolation device is located between the first well sector and the second well sector. The isolation device can have its gate terminal biased to a voltage greater than a supply voltage VDD during a program operation, a read operation and the erase operation. Alternately, the isolation device can be rendered electrically non-conductive in the erase operation for isolating the first bitline segment from the second bitline segment when one of the first NAND cell string and the second NAND cell string is selected for erasure. The isolation device can be turned off in response to a control signal or in response to a well sector selection signal. The NAND flash memory can further include a bitline segment decoder for enabling the isolation device in response to a well sector selection signal during a read operation, the bitline segment decoder disabling the isolation device in response to an erase control signal during an erase operation. The bitline segment decoder can include an isolation device driver for receiving the erase control signal and the well sector selection signal, the isolation device driver providing an isolation drive signal for controlling the isolation device when the well sector selection signal is at an active logic level. The isolation device driver can include an override circuit for driving the well sector selection signal to the active logic level in response to another well sector selection signal at the active logic level.

In a second aspect, the present invention provides a NAND Flash memory. The NAND Flash memory includes at least two well sectors each including at least one memory block of NAND cell strings, and isolation devices. The at least one memory block in each of the at least two well sectors is electrically connected to corresponding bitline segments, and the isolation devices are coupled between the bitline segments corresponding to the at least two well sectors. Each of the at least two well sectors can include two memory blocks. The isolation devices can have gate terminals biased to a predetermined voltage which can be greater than a supply voltage VDD. Alternately, the isolation devices are turned off during an erase operation, or are selectively turned off during a read operation. During a read operation the isolation devices between a selected well sector including a selected memory block and a page buffer are turned on. The NAND flash memory further includes a selector for selectively passing an erase voltage to one of the at least two well sectors. The selector couples the erase voltage to one of the at least two well sectors in response to a portion of a block address, the block address being decoded to select one memory block for erasure. The NAND flash memory can further include a page buffer electrically connected to the bitline segments corresponding to one of the at least two well sectors.

In a third aspect, the present invention provides a method for erasing a selected memory block in a NAND Flash device. The method includes selecting a memory block in a first well sector, the first well sector including at least two memory blocks; biasing the memory block formed in the first well sector for erasure; biasing an unselected memory block formed in the first well sector for inhibiting erasure; applying an erase voltage to the first well sector; and, inhibiting application of the erase voltage to a second well sector including at least another two memory blocks. The method can further include decoupling bitline segments corresponding to the first well sector and the second well sector from each other before applying the erase voltage to the first well sector. Alternately, the method can further include decoupling bitline segments corresponding to the first well sector and the second well sector from each other with an isolation device when a bitline voltage of the first well sector is at least a predetermined bias voltage applied to a gate terminal of the isolation device.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described, by way of example only, with reference to the attached Figures, wherein.

DETAILED DESCRIPTION

A Flash memory device with reduced power consumption and minimal erase voltage disturb is obtained by forming all memory blocks in different well sectors. Each well sector can include for example, a device well within which the NAND cell strings of the memory block(s) are formed in, and isolation wells for isolating the substrate from the device wells. At least one well sector is selectively coupled to an erase voltage during an erase operation, such that unselected well sectors are inhibited from receiving the erase voltage, thereby minimizing erase disturb in the unselected well sectors. Because each well sector has a small area relative to a single well that includes all memory banks, the capacitance of each well sector is small. This results in several advantages such as higher speed erasing or reduced charge pump size, as will be discussed with reference to the following embodiments and examples.

Figure 2:
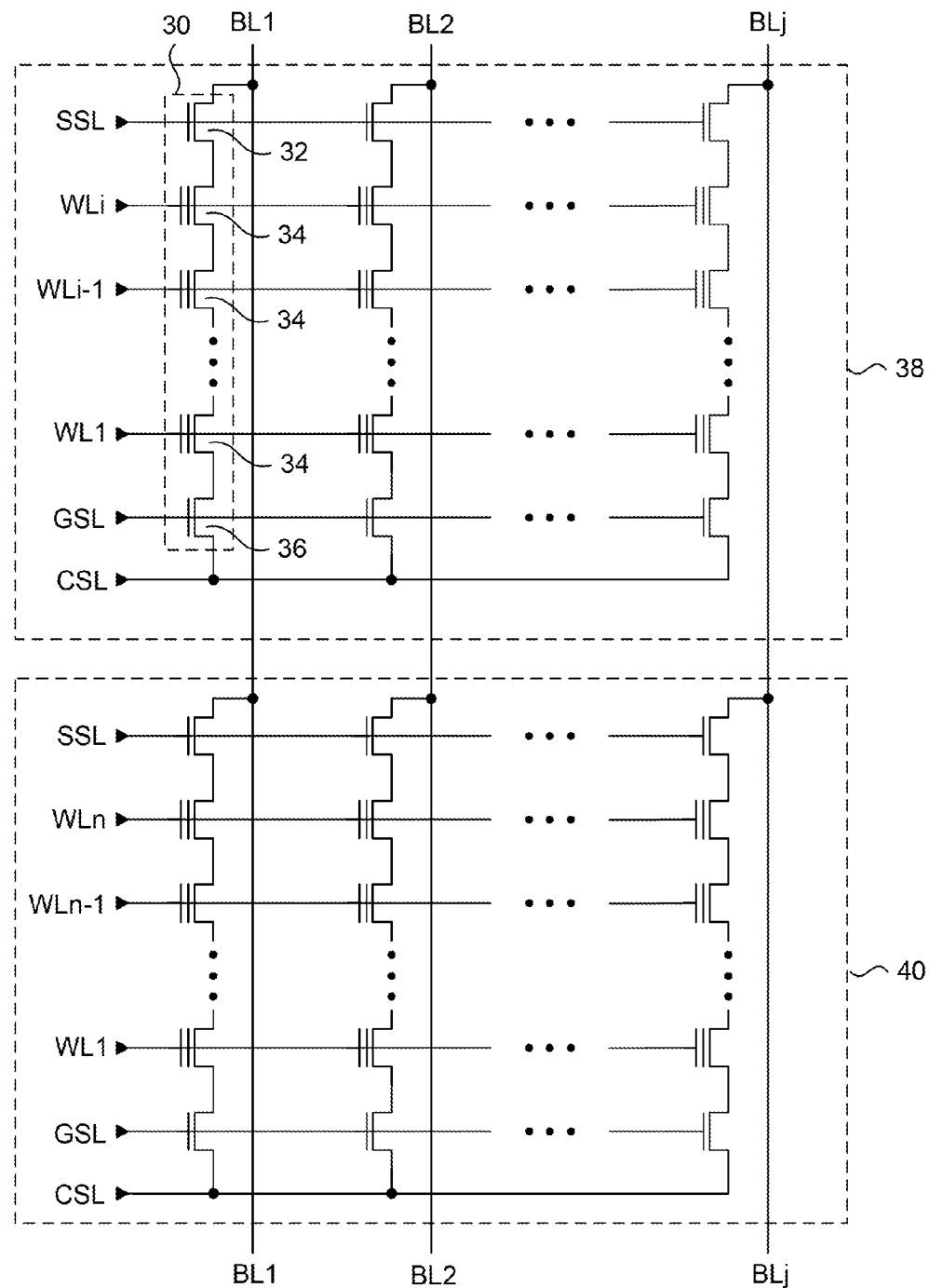
FIG. 2 is a circuit schematic showing circuit details of two memory blocks in one memory array of the flash memory chip of FIG. 1B.
Figure 6:
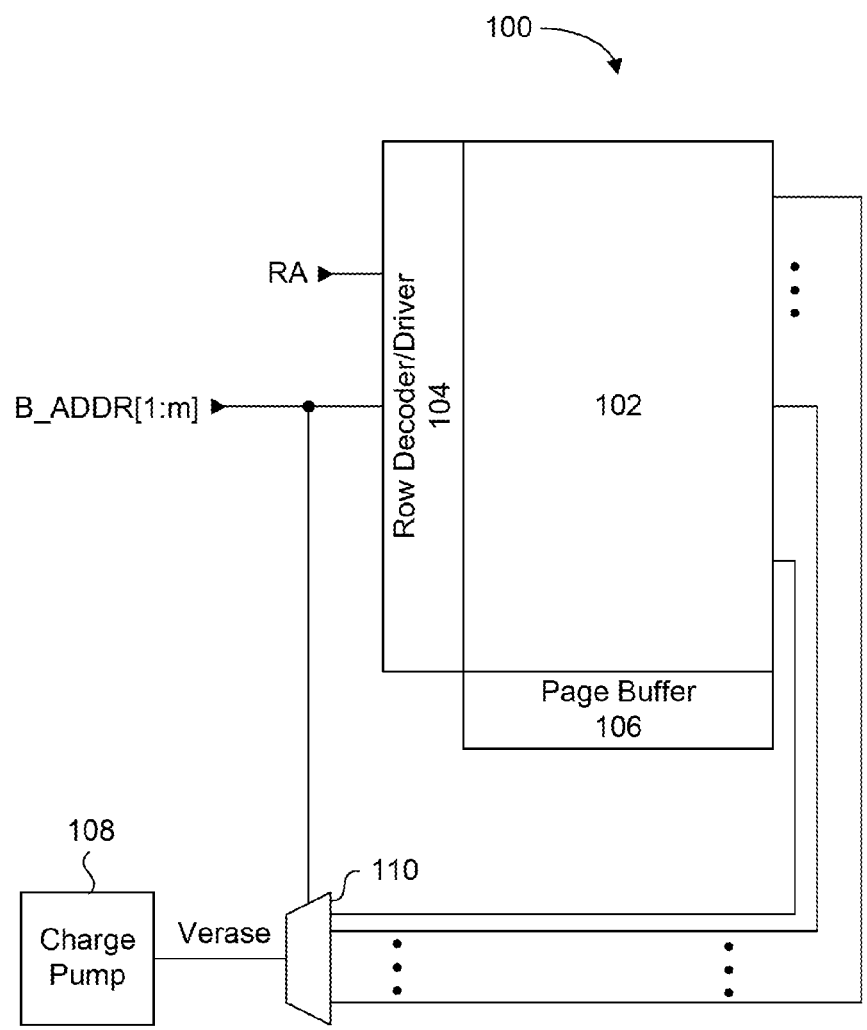
FIG. 6 is a block diagram of a NAND flash memory bank according to an embodiment of the present invention.

FIG. 6 illustrates a NAND flash memory bank according to an embodiment of the present invention. The particular example illustrated in FIG. 6 has reduced substrate capacitance. FIG. 6 is a block diagram of one NAND flash memory bank 100, including a memory array 102 having NAND cell strings similar to those shown in FIG. 2, a row decoder 104 for driving wordlines connected to the devices of the NAND cell strings, and a page buffer 106 connected to bitlines for coupling read and program data to the NAND cell strings. The memory array 102 includes at least two different well sectors where NAND cell strings are formed. The NAND cell strings are organized as memory blocks, such as those shown in FIG. 2, and each well sector includes at least one memory block. A charge pump 108 generates the erase voltage Verase, which is provided to a selector 110. Selector 110 selectively passes Verase to one of the at least two well sectors of memory array 102.

Row decoder 104 receives a block address for selecting a particular memory block for read, program and erase operations. Row decoder 104 further receives a multi-bit row address RA for providing individual row drive signals that are used for activating selected wordlines, string select lines SSL and source select lines GSL. Row address RA can be a predecoded row address or a row address provided from the address registers, or any other upstream circuit. In the presently shown example, a block address B_ADDR[1:m] is used to address up to $2^m$ memory blocks, where "m" can be any non zero integer value representing the number of individual address signals that make up B_ADDR[1:m]. Depending on the number of well sectors formed within memory array 102, one or all individual address signals of B_ADDR[1:m] are provided to selector 110. According to the present examples, the well sector including the memory block selected for erasure will be biased to Verase. All unselected well sectors are inhibited from receiving Verase, by biasing them to 0V or VSS for example.

Figure 7A:
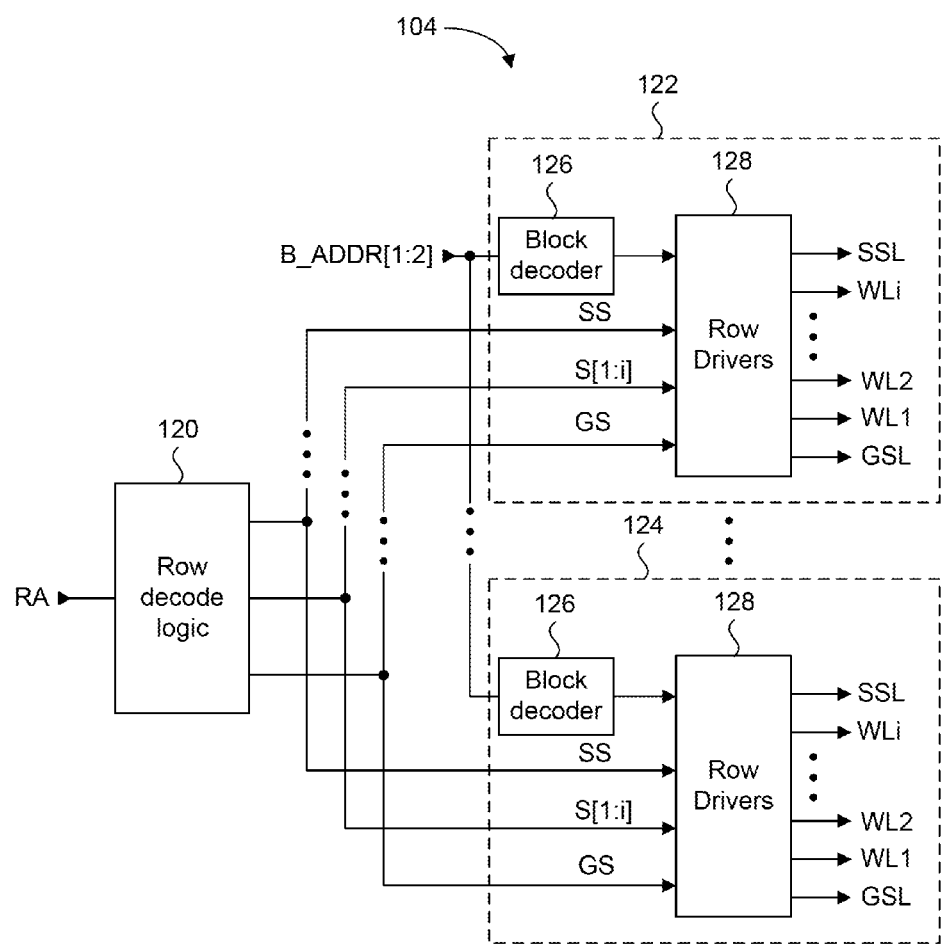
FIG. 7A is a block diagram of a row decoder used in the NAND flash memory bank of FIG. 6.

FIG. 7A shows an example of row decoder 104 of NAND flash memory bank 100 shown in FIG. 6. Referring to FIGS. 6 and 7A, row decoder 104 includes row decode logic 120, and memory block drive circuits 122 and 124 for respective memory blocks. In the particular example, there are four memory blocks in memory array 102. Row decode logic 120 receives multi-bit row address RA for generating individual row drive signals such as SS, S[1:i] and GS. In the present example, there is one row decode logic 120 for all the memory blocks in memory array 102, and the row drive signals SS, S[1:i] and GS are global signals provided to each memory block drive circuit 122 and 124 of the memory array 102. In particular, global signals SS, GS and S[1:l] correspond respectively to SSL, GSL and wordlines in each memory block drive circuit, such as circuits 122 to 124 for example. Row decode logic 120 includes well known logic circuits for decoding multi-bit row address RA and its details are not described. FIG. 7A shows two memory block drive circuits 122 and 124, but those skilled in the art will understand that there is one memory block drive circuit for each memory block in memory array 102. In the present example, there are a total of four memory block drive circuits, two of which are not shown in order to simplify the drawing.

Memory block drive circuit 122 includes the same circuit elements as memory block drive circuit 124, hence only the elements for memory block drive circuit 122 are described in further detail. Memory block drive circuit 122 includes a block decoder 126 and row drivers 128. In the example shown in FIG. 7A, block decoder 126 of memory block drive circuit 122 receives a two-bit block addresses B_ADDR[1:2] for enabling its corresponding row drivers 128. Accordingly, one block decoder is enabled for any combination of B_ADDR[1:2] to select the memory block for an erase, program or read operation. Row drivers 128 includes devices for passing row drive signals SS, S[1:i] and GS to SSL, the wordlines WL[1:i] and GSL, respectively, of the NAND cell strings in the memory block. Therefore in response to the multi-bit row address RA, SSL, GSL and one wordline WL1 to WLi, are driven to the active logic level such as VDD by row decode logic 120. In response to a block address, only the row drivers 128 of one selected memory block addressed by block addresses B_ADDR[1:2] are enabled for driving or passing the row drive signals SS, S[1:i] and GS as SSL, WL[1:i] and GSL respectively to the NAND cell strings. In an unselected memory block the row drivers 128 are disabled, thereby preventing SSL, WL[1:i] and GSL from receiving the voltage level of row drive signals SS, S[1:i] and GS respectively.

Figure 7B:
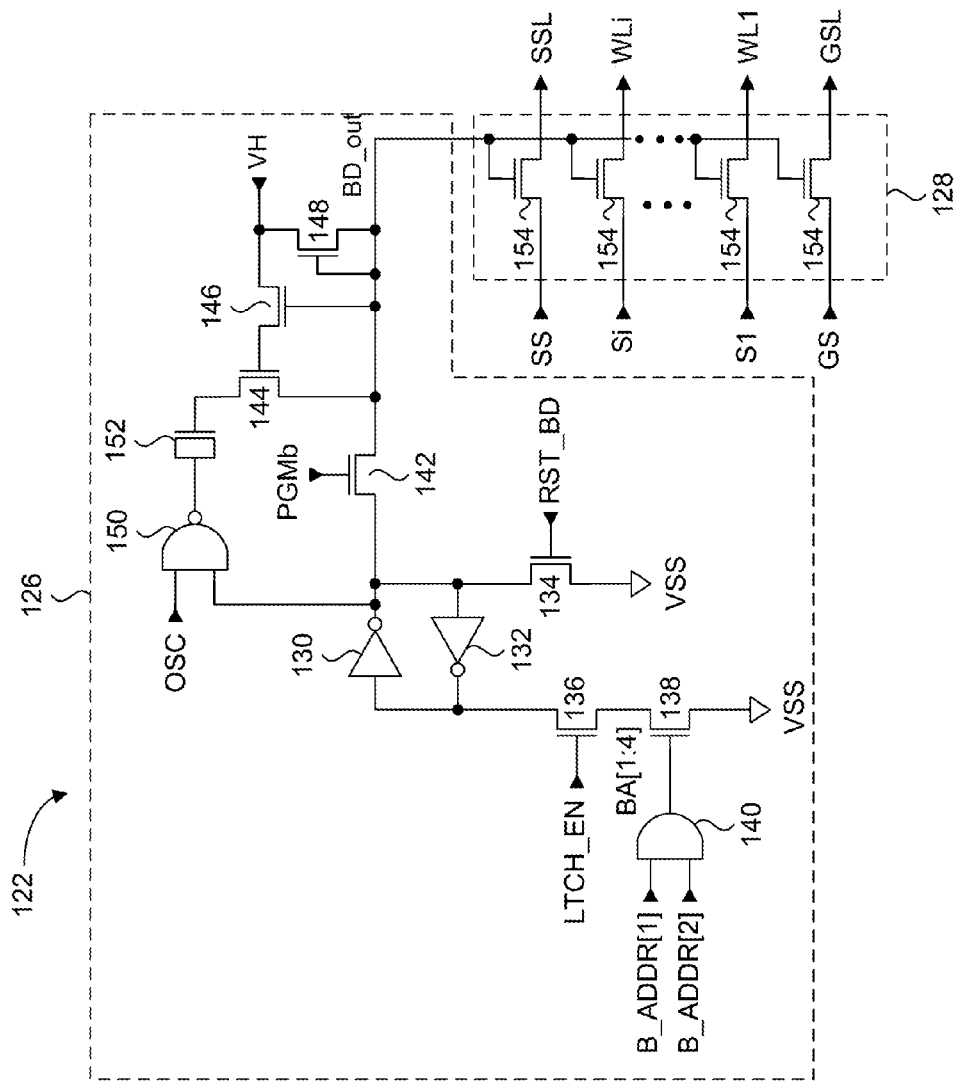
FIG. 7B is circuit schematic of a memory block drive circuit shown in FIG. 7A.

FIG. 7B is circuit schematic of the block decoder 126 and row drivers 128 of one memory block drive circuit, such as memory block drive circuit 122, shown in FIG. 7A. Block decoder 126 is associated with one memory block, and includes a cross coupled inverter latch circuit and charge pump. The latch circuit includes cross-coupled inverters 130 and 132, an n-channel reset transistor 134, and n-channel enable transistors 136 and 138. The latch circuit is enabled, or set, when latch enable signal LTCH_EN and a decoded block address BA[1:4] are at the high logic level. Decoded block address BA[1:4] is also referred to as a block select signal. The four individual signals of decoded block address BA[1:4] are generated by AND logic gate 140, which receives block addresses B_ADDR[1] and B_ADDR[2]. Those skilled in the art should understand that the AND logic gate 140 for different block decoders 126 of the memory bank receives is responsive to different logic state combinations of B_ADDR[1] and B_ADDR[2] for selecting one memory block for read, program and erase operations. When a reset signal RST_BD is driven to the high logic level, of VDD for example, reset transistor 134 is turned on to couple the input of inverter 132 to VSS. This results in the latch circuit of inverters 130 and 132 to be reset.

The block decoder 126 includes a local charge pump coupled to the output of inverter 130. The charge pump includes a depletion mode n-channel pass transistor 142, a native n-channel diode-connected boost transistor 144, a high breakdown voltage n-channel decoupling transistor 146, a high breakdown voltage n-channel clamp transistor 148, a NAND logic gate 150, and a capacitor 152. NAND logic gate 150 has one input terminal coupled to the output of inverter 130 and another input terminal for receiving controlled signal OSC, for driving one terminal of capacitor 152. Pass transistor 142 is controlled by the complement of a program signal PGM, referred to as PGMb. The common terminals of decoupling transistor 146 and clamp transistor 148 are coupled to high voltage VH.

The operation of the charge pump is now described. During a read or erase operation, PGMb is at the high logic level and OSC is maintained at the low logic level. Therefore, circuit elements 152, 144, 146 and 148 are inactive, and the output terminal BD_OUT reflects the logic level appearing on the output of inverter 130. During a program operation, PGMb is at the low logic level, and OSC is allowed to oscillate between the high and low logic levels at a predetermined frequency. If the output of inverter 130 is at the high logic level, then capacitor 152 will repeatedly accumulate charge on its other terminal and discharge the accumulated charge through boost transistor 144. Decoupling transistor 146 isolates VH from the boosted voltage on the gate of boost transistor 144. Clamp transistor 148 maintains the voltage level of output terminal BD_OUT at about VH+Vtn, where Vtn is the threshold voltage of clamp transistor 148. The local charge pump shown in FIG. 7B is one example circuit which can be used to drive signals to a voltage levels higher than the supply voltage VDD, but persons skilled in the art will understand other charge pump circuits can be used with equal effectiveness.

Row drivers 128 includes a plurality of n-channel pass transistors 154, each having its gate terminal electrically coupled to the output terminal BD_OUT for passing the row drive signals SS, S[1:i] and GS at SSL, the wordlines WL[1:i] and GSL, respectively, to the NAND cell strings. If the output terminal BD_OUT is driven above VDD, then row drive signals SS, S[1:i] and GS greater than VDD can be passed onto SSL, WL[1:i] and GSL lines, respectively. If the output terminal BD_OUT is at VSS, then the pass transistors 154 will be turned off to decouple the row drive signals SS, S[1:i] and GS from SSL, WL[1:i] and GSL, respectively.

Figure 8A:
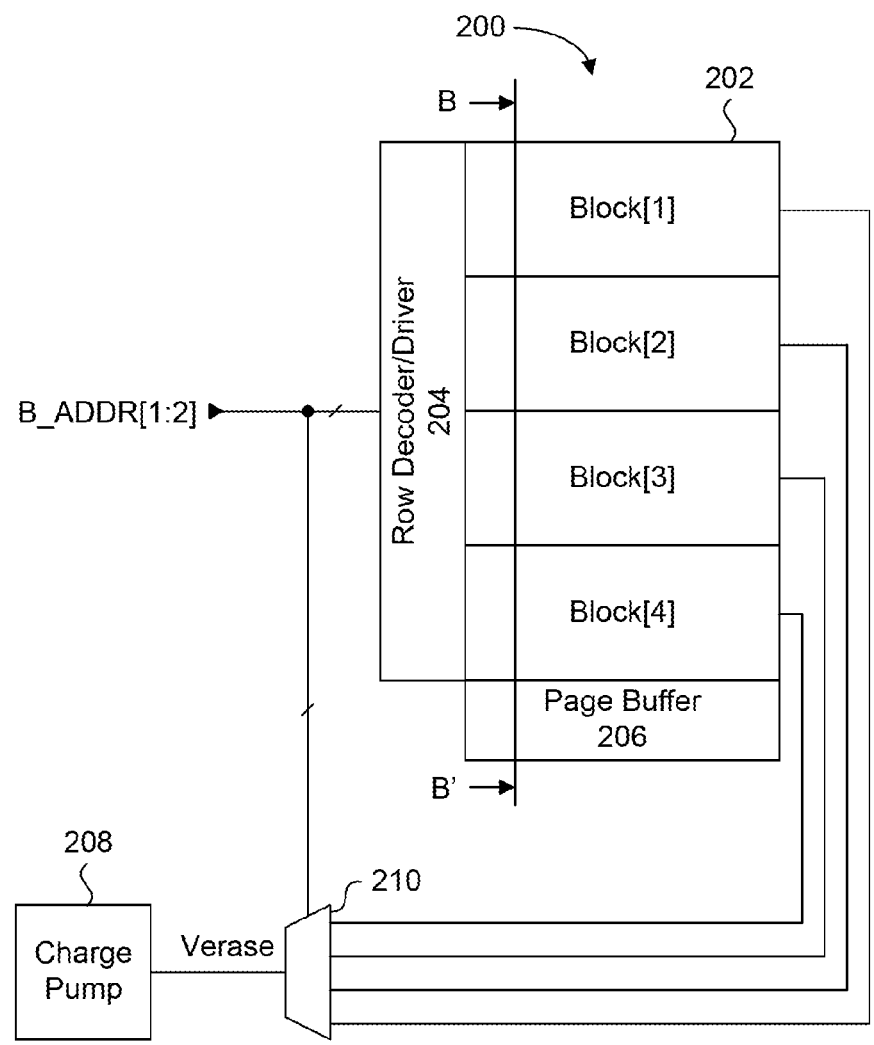
FIG. 8A is a block diagram of a NAND flash memory bank having one memory block per well sector, according to an example of the NAND flash memory bank of FIG. 6.

FIG. 8A shows a NAND flash memory bank according to an example of the NAND flash memory bank embodiment of FIG. 6. The NAND flash memory bank has reduced substrate capacitance. Referring to FIG. 8A, one NAND flash memory bank 200 has a memory array 202 including NAND cell strings similar to those shown in FIG. 2. The NAND flash memory bank 200 has also a row decoder 204 for driving wordlines connected to the devices of the NAND cell strings, and a page buffer 206 connected to bitlines for coupling read and program data to the NAND cell strings. A charge pump 208 generates the erase voltage Verase, which is provided to a selector 210. In the illustrated example, the memory array 202 has four different well sectors, each selectively receiving Verase during a block erase operation. Each of the four well sectors includes exactly one memory block, referred to as Block[1], Block[2], Block[3] and Block[4]. Accordingly, a two-bit block address B_ADDR[1:2] is used for selecting one of four memory blocks, and row decoder 204 includes the appropriate logic for decoding the two-bit block address B_ADDR[1:2]. The same block address is received by selector 210 for passing Verase to the well sector which includes the corresponding selected memory block. Selector 210 can be implemented as a 1 to 4 demultiplexor responsive to a two-bit control or address signal.

Figure 8B:
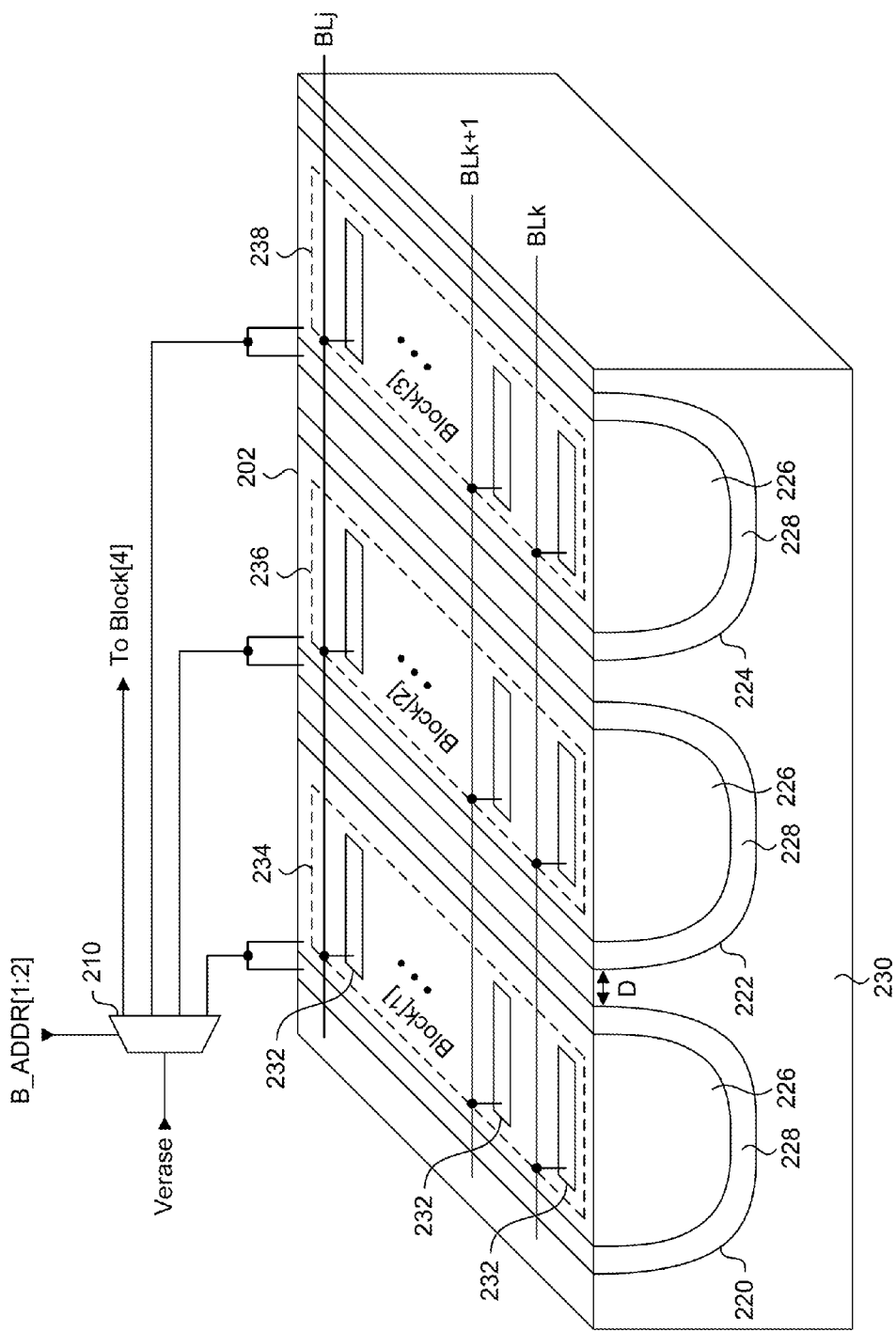
FIG. 8B is a cross-sectional diagram of one memory array of the NAND flash memory bank of FIG. 8A.

FIG. 8B is a cross-sectional diagram of memory array 202 taken along line B-B' in FIG. 8A, and angled to show specific features on its surface. In FIG. 8B, only the first three well sectors 220, 222 and 224 are shown, where each well sector includes a p-type well 226 formed within an n-type isolation well 228, the n-type isolation well 228 being formed within a p-type substrate 230. Both the n-type isolation well 228 and the p-type well 226 are ion implanted regions having two-dimensional surface areas on the chip formed through well known masking steps that delineate their specific shapes. Because the substrate 230 is p-type, the n-type isolation wells 228 are used to electrically isolate the p-type substrate 230 from the p-type wells 226. The depth and concentration of wells 226 and 228 is determined by the ion implantation energy and dose, which are both fabrication design parameters of the semiconductor device. As clearly shown in FIG. 8B, the NAND cell strings are formed in the p-type wells 226. In an alternate example where substrate 230 is n-type instead of p-type, the n-type isolation wells 228 are omitted, and the well sectors 220, 222 and 224 have p-type wells 226. According to the present examples, each well sector includes at least the device well the NAND cell strings are formed within, and optionally includes isolation wells for isolating the substrate 230 from the device wells 226.

In the presently shown example of memory array 202, well sectors 220, 222 and 224 include memory blocks 234, 236 and 238 respectively. Each memory block includes NAND cell strings 232 electrically coupled to respective bitlines, such as bitlines BLk and BLk+1 to BLj for example. While not shown in FIG. 8B, the bitlines are connected to a page buffer for sensing cell data and for providing program data. The possible circuit implementations of page buffers, and their operation should be well known to persons of skill in the art. The selector 210 is shown in FIG. 8B to show its interconnection with the well sectors 220, 222 and 224 of memory array 202. Selector 210 receives Verase and electrically couples Verase to one of the four well sectors in response to the two-bit block address B_ADDR[1:2]. As shown in FIG. 8B, each output of selector 210 is connected to a respective p-type well 226 as well as its corresponding isolation well 228. This is to ensure that the junction between the p-type substrate 230 and the n-type isolation well 228 is reverse biased.

Figure 3:
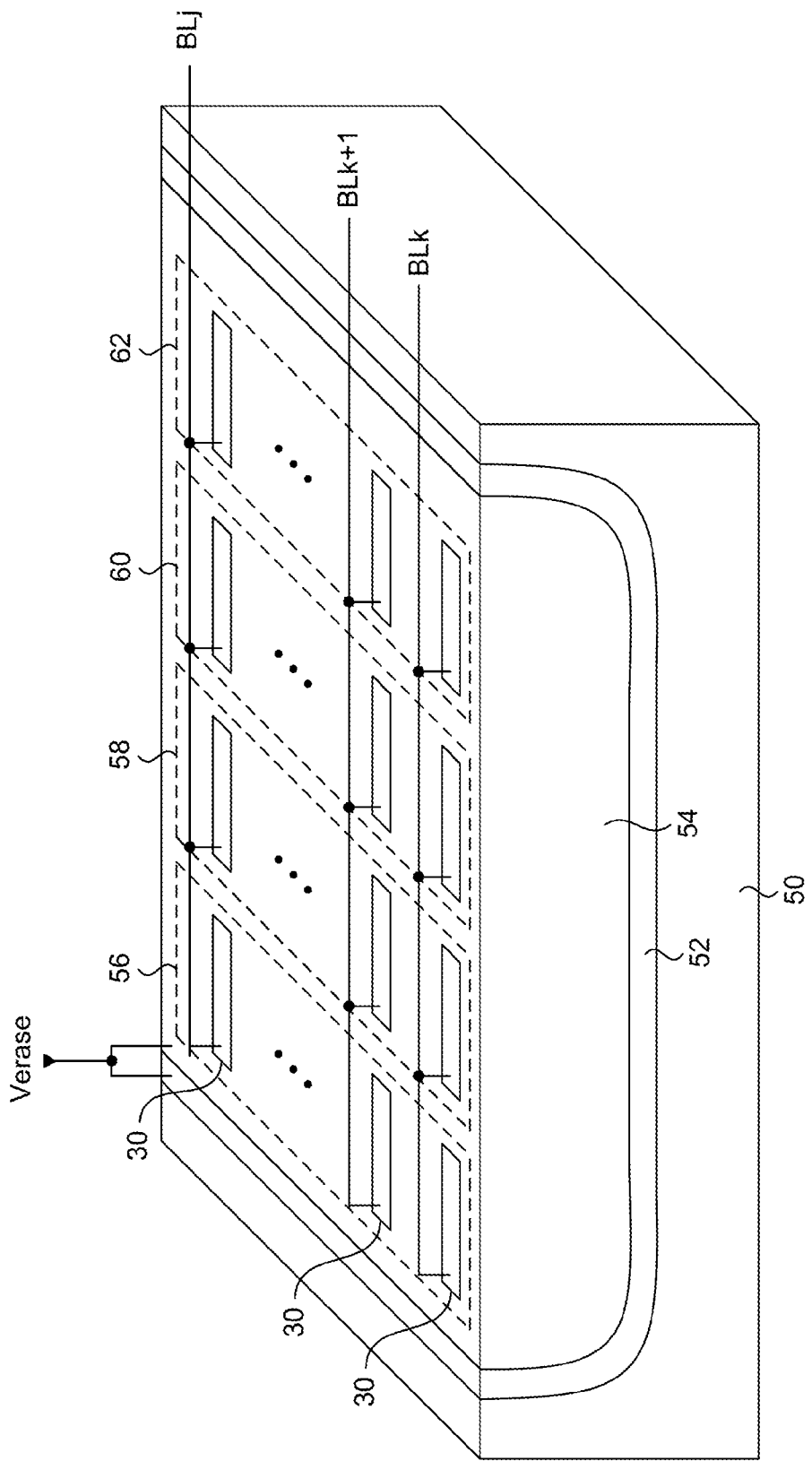
FIG. 3 is a cross-sectional diagram of one memory array of the flash memory chip of FIG. 1B.

The advantage of having separate well sectors for each memory block of the memory bank is the reduced capacitive loading of the charge pump relative to the single well memory bank of the known NAND flash memory bank of FIG. 3. An example comparison between the single well memory bank of FIG. 3 and the multiple well sector example of FIGS. 8A and 8B follows. It is first assumed that the memory bank of FIG. 3 and the memory bank of FIG. 8A include exactly four memory blocks, have the same number of NAND cell strings per memory block, and the same charge pump fabricated with the same process and technology node. As previously discussed, t_delay is the amount of time p-type well 54 charges up from VSS to Verase during an erase operation for erasing one memory block. In the NAND flash memory bank of FIG. 8A/8B, the capacitance of one p-type well 226 is effectively ¼ that of p-type well 54. Accordingly, the voltage level of p-type well 226 will rise from VSS to Verase in less time than t_delay. Alternatively, if the erase time of the memory bank of FIG. 3 is to be maintained for the NAND flash memory bank of FIG. 8A, then the charge pump circuit capacity can be decreased. This can be done through a combination of reducing the size of capacitor elements and/or eliminating entire capacitor elements. Therefore semiconductor chip area is reduced, and the cost of the NAND flash memory device is correspondingly reduced. Furthermore, since the capacitance of each well sector is smaller than that of p-type well 54, significant power savings is realized.

A further advantage of the NAND flash memory bank of FIGS. 8A and 8B is that unselected memory blocks do not receive Verase, thereby eliminating erase disturb in the unselected memory blocks. This is because each memory block of FIGS. 8A and 8B resides in its own well sector. Accordingly, the wordlines in the unselected memory blocks residing in unselected well sectors do not self-boost, and are allowed to float at about the VSS voltage level.

An erase operation executed upon the example NAND flash memory bank of FIGS. 8A and 8B is now described with reference to the memory block drive circuit 122 shown in FIG. 7B. In the erase operation for the example of FIGS. 8A and 8B, one memory block is selected while other blocks remain unselected. In otherwords, one memory block is enabled while remaining memory blocks are disabled. In the present example erase operation, it is assumed that only memory block Block[1] is to be erased. Accordingly, the operation of memory block drive circuit 122 is described, while the operation of memory block drive circuit 124 is described for any one of the unselected memory blocks. To select a memory block for erasure, LTCH_EN and BA[1:4] of memory block drive circuit 122 will be at the high logic level, thereby setting the level shifter circuit to output high voltage Vh. Therefore, all the pass transistors 154 of wordline driver circuit 128 are turned on. The row drive signals S1 to Si are driven to VSS while row drive signals SS and GS are floated, and the selected well sector having the selected memory block is biased to Verase. Memory block drive circuit 124 for an unselected memory block will have its corresponding block decoder circuit output set to output low voltage Vn. Therefore, all the pass transistors 154 corresponding to the unselected memory blocks will be turned off. Accordingly, the wordlines, SSL and GSL for the unselected memory blocks will float at approximately VSS, since these lines are typically biased to VSS after any read or program operation.

Table 1 below summarizes example biasing conditions during an erase operation for a selected memory block and an unselected memory block, where the selected memory block resides in one well sector and the unselected memory block resides in a different well sector. A memory block is selected by providing the block address B_ADDR[1:2] of the selected memory block to row decoder 204, which is decoded to enable control of the wordlines and select lines (SSL and GSL) corresponding to the selected memory block. Because B_ADDR[1:2] is received by selector 210, Verase is passed to the well sector which includes the selected memory block.

TABLE 1

|  | Selected Well Sector Selected Memory Block | Unselected Well Sector Unselected Memory Block |
| --- | --- | --- |
| Bitlines (B/L) | Clamped to Verase-0.6 V | Clamped to Verase-0.6 V |
| String Select Line (SSL) | Floated | Unselected |
| Wordlines | 0 V | Unselected |
| Ground Select Line (GSL) | Floated | Unselected |
| Common Source Line (CSL) | Clamped to Verase-0.6 V | 0 V |
| P-Well | Verase | 0V |

In order to erase a selected memory block in the example NAND flash memory bank of FIGS. 8A and 8B, the wordlines are biased to VSS, or 0V, the common source line CSL (hereinafter referred to as "CSL line") is clamped to about Verase-0.6V, and SSL and GSL are left to float. Decoded row drive signals SS and GS for the SSL and GSL lines are floated during erase to minimize the electric field on pass transistors for SSL and GSL. It is noted that the capacitance of drive lines SS and GS are much larger than that of SSL and GSL. Therefore, SSL and GSL may remain at nearly VSS because any boosted charge on SSL and GSL resulting from the well voltage rising to Verase will leak through the pass transistors to the SS and GS drive lines.

Finally, the selected well sector within which the selected memory block resides is biased to Verase. Under these conditions, trapped charge in the floating gates of the flash memory cells of the NAND cell strings will emit their charge to the well. As previously shown in FIG. 2 and FIG. 4, all bitlines are shared by the memory blocks in the memory bank, and have bitline contacts electrically connected to the n+ diffusion region 88 corresponding to each NAND cell string. The n+ diffusion regions 88 are forward biased when the selected well sector is raised to the erase voltage Verase, resulting in the bitlines being clamped to Verase-0.6V. As previously shown in FIG. 2 and FIG. 4, the CSL line is shared by all the NAND cell strings in the same memory block via n+ diffusion region 82. Hence when the selected well sector is raised to Verase, the n+ diffusion region 82 is forward biased raise and clamp the CSL line of the selected memory block in the selected well sector to Verase-0.6V. On the other hand, the CSL line for an unselected memory block in an unselected well sector is biased to VSS or 0V. It is noted that in the present examples, the CSL line is common only to the NAND cell strings of one memory block. All wordlines, string select lines (SSL) and ground select lines (GSL) in the unselected memory block remain in an unselected state, meaning that the pass transistors 154 in the wordline driver 128 are turned off.

FIGS. 8A and 8B illustrate an example NAND flash memory bank where there is exactly one memory block per well sector in memory bank array 202. Depending on the fabrication process and technology node being used for manufacturing NAND flash memory bank 200, adjacent well sectors are spaced from each other by a minimum distance "D", as shown in FIG. 8B. This minimum distance D can be set to be the minimum design rule spacing for adjacent n-type isolation wells. By example only, the spacing between adjacent n-type isolation wells 228 can be between 3 to 10 microns.

Figure 9A:
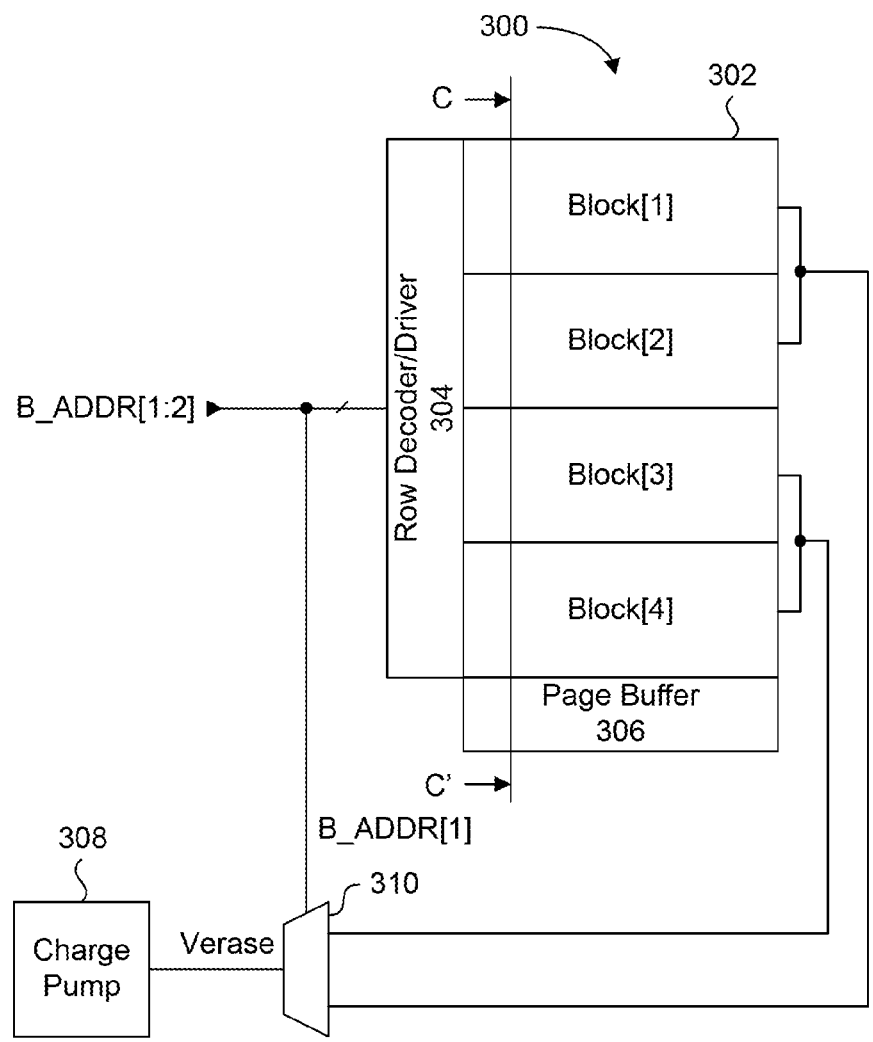
FIG. 9A is a block diagram of a NAND flash memory bank having multiple memory blocks per well sector, according to another example of the NAND flash memory bank of FIG. 6.

In another example of memory array 202, each well sector of the memory bank includes more than one memory block to minimize the size of the memory array while reducing the capacitance of each well sector. FIG. 9A is a block diagram of a NAND flash memory bank with reduced memory array area relative to the example NAND flash memory bank of FIG. 8A. Referring to FIG. 9A, one NAND flash memory bank 300 has a memory array 302 including NAND cell strings similar to those shown in FIG. 2, a row decoder 304 for driving wordlines connected to the devices of the NAND cell strings, and a page buffer 306 connected to bitlines for coupling read and program data to the NAND cell strings. A charge pump 308 generates the erase voltage Verase, which is provided to a selector 310. By example only, the illustrated NAND flash memory bank has a memory array 302 including two different well sectors, each selectively receiving Verase during a block erase operation. Memory array 302 includes four memory blocks, referred to as Block[1], Block[2], Block[3] and Block[4]. Accordingly, a two-bit block address B_ADDR[1:2] is used for selecting one of four memory blocks and row decoder 304 includes the appropriate logic for decoding the two-bit block address B_ADDR[1:2].

In the memory array 302, a first well sector includes memory blocks Block[1] and Block[2], and a second well sector includes memory blocks Block[3] and Block[4]. A pair of two well sectors is selected during an erase operation. A single bit block address signal is received by selector 310 for passing Verase to the well sector which includes the selected memory block. If B_ADDR[1] is the most significant block address bit for selecting which pair of memory blocks is to be selected, then B_ADDR[2] is the least significant block address bit for selecting one memory block of the selected pair of memory blocks. Selector 310 is a 1-to-2 demultiplexor, or selector, responsive to a single-bit control or address signal. Because the example of FIG. 9A has two memory blocks formed in each well sector, only one of the two well sectors is selected for any memory block erase operation. Therefore block address B_ADDR[1] is used by selector 310 for passing Verase to one of the two well sectors. In otherwords, selector 310 receives a portion of the block address for selectively passing Verase to one of the two well sectors.

Figure 9B:
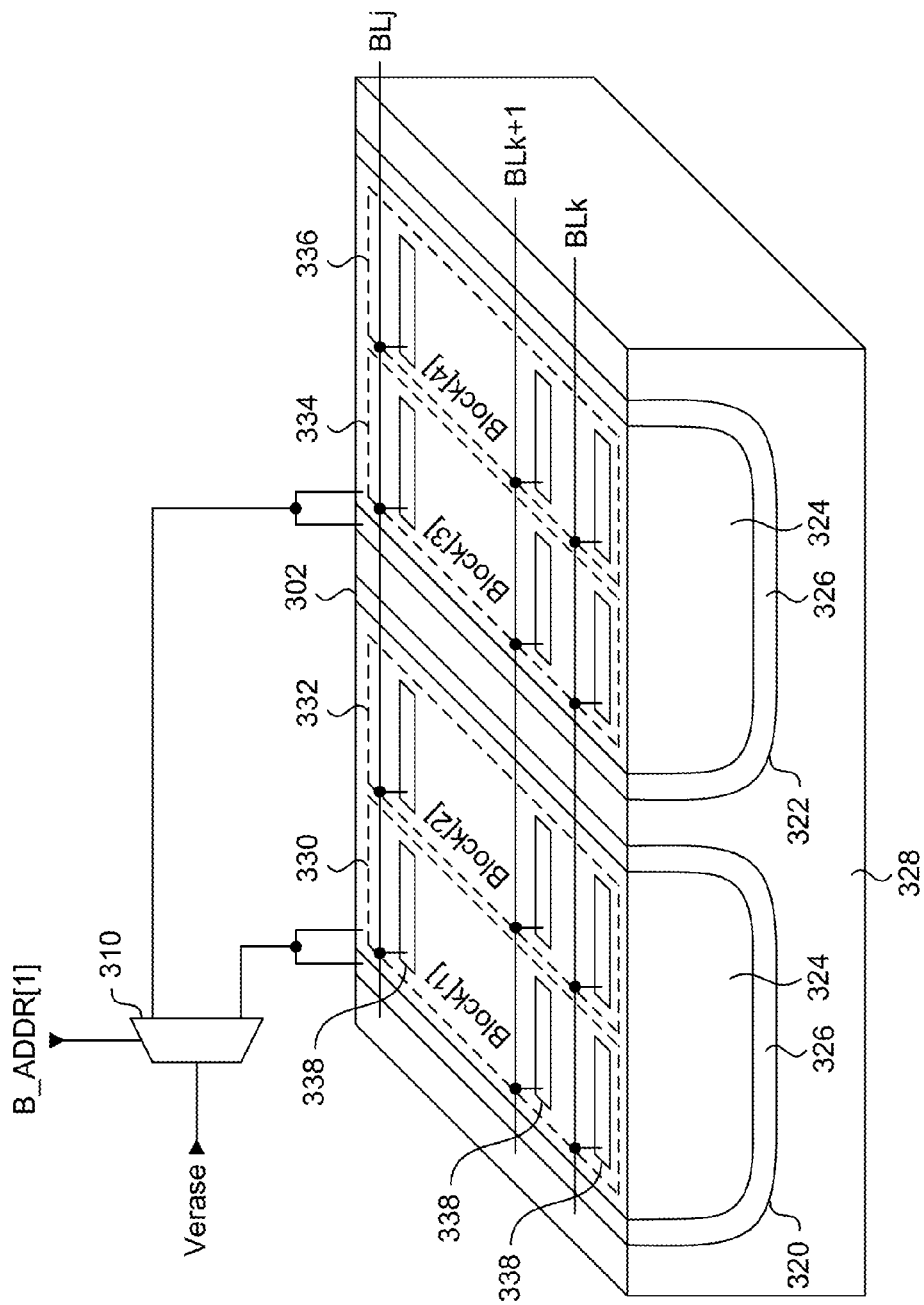
FIG. 9B is a cross-sectional diagram of one memory array of the NAND flash memory bank of FIG. 9A.

FIG. 9B is a cross-sectional diagram of memory array 302 of FIG. 9A taken along line C-C', and angled to show specific features on its surface. In FIG. 9B, two well sectors 320 and 322 are shown, where each well sector includes a p-type well 324 formed within an n-type isolation well 326, the n-type isolation well 326 being formed within a p-type substrate 328. Both the n-type isolation well 326 and the p-type well 324 are ion implanted regions having two-dimensional surface areas on the chip formed through well known masking steps that delineate their specific shapes. The depth and concentration of wells 226 and 228 is determined by the ion implantation energy and dose, which are both fabrication design parameters of the semiconductor device. As clearly shown in FIG. 9B, the NAND cell strings are formed in the p-type wells 324. In an alternate example where substrate 328 is n-type instead of p-type, the n-type isolation wells 326 are omitted, and the well sectors 320 and 322 have p-type wells 324. According to the present examples, each well sector includes at least the device well the NAND cell strings are formed within, and optionally includes isolation wells for isolating the substrate from the device wells.

In the presently shown example of memory array 302, well sector 320 includes memory blocks 330 and 332, which correspond to memory blocks Block[1] and Block[2] respectively. Well sector 322 includes memory blocks 334 and 336, which correspond to memory blocks Block[3] and Block[4] respectively. Each memory block includes NAND cell strings 338 electrically coupled to respective bitlines, such as bitlines BLk and BLk+1 to BLj for example. While not shown in FIG. 9B, the bitlines are connected to a page buffer for sensing cell data and for providing program data. The possible circuit implementation of page buffers, and their operation should be well known to persons of skill in the art. The selector 310 is shown in FIG. 9B to show its interconnection with the well sectors 320 and 322 of memory array 302. Selector 310 receives Verase and electrically couples Verase to one of the two well sectors in response to the single-bit block address B_ADDR[1]. As shown in FIG. 9B, each output of selector 310 is connected to a respective p-type well 324 as well as its corresponding isolation well 326.

The erase operation for a selected memory block in the example NAND flash memory bank of FIGS. 9A and 9B is similar to that described for the example NAND flash memory bank of FIGS. 8A and 8B, except that an erase inhibit scheme is applied to the unselected memory block of the selected well sector that receives the erase voltage Verase. This is due to the fact that each well sector has both a selected memory block to be erased and an unselected memory block. Therefore, the flash memory cells of the unselected memory block in the well sector receiving Verase is erase inhibited. By example, the previously described self-boosting erase inhibit scheme can be used for inhibiting erasure of the flash memory cells of the unselected memory block in the selected well sector, where a selected well sector is the one that receives Verase. For example, if memory block 332 (Block[2]) is selected for erasure, then the wordlines and select lines (SSL and GSL) corresponding to selected memory block 332 are biased to the erase condition, and Verase is applied to well sector 320. Memory block 330 is erase inhibited to prevent erasure of its flash memory cells because it is formed within the same p-type well 324 as memory block 332.

Table 2 summarizes example biasing conditions during an erase operation for a selected memory block and an unselected memory block in the selected well sector that receives Verase, and for unselected memory blocks in an unselected well sector that does not receive Verase.

TABLE 2

| | Selected well sector | | Unselected well sector |
|---|---|---|---|
| | Selected Memory Block | Unselected Memory Blocks | All Memory Blocks |
| Bitlines (BL) | Clamped to Verase-0.6 V | Clamped to Verase-0.6 V | Clamped to Verase-0.6 V |
| String Select Line (SSL) | Floated | Boosted to about 90% of Verase | Unselected |
| Wordlines (WL0-WL31) | 0 V | Boosted to about 90% of Verase | Unselected |
| Ground Select Line (GSL) | Floated | Boosted to about 90% of Verase | Unselected |
| Common Source Line (CSL) | Clamped to Verase-0.6 V | Clamped to Verase-0.6 V | 0 V |
| Well sector | Verase | Verase | 0V |

The erase bias conditions for the word lines and SSL and GSL are the same as for the NAND flash memory bank examples of FIGS. 8A, 8B and FIGS. 9A, 9B, as are the bias conditions for the unselected memory blocks in the unselected well sectors. However, for the unselected memory blocks of the selected well sector, the wordlines are self boosted to about Verase. When the wordlines are approximately Verase, there is a minimal electrical field formed between the wordlines and the p-type well 324 of the selected well sector, thereby inhibiting erasure of the flash memory cells of the unselected memory block.

While FIGS. 8A, 8B and 9A, 9B show examples where there is exactly one memory block formed per well sector and two memory blocks formed per well sector in one memory array, alternate examples can include any number of well sectors in each memory array, where each well sector can include any number of memory blocks formed therein.

Figure 4:
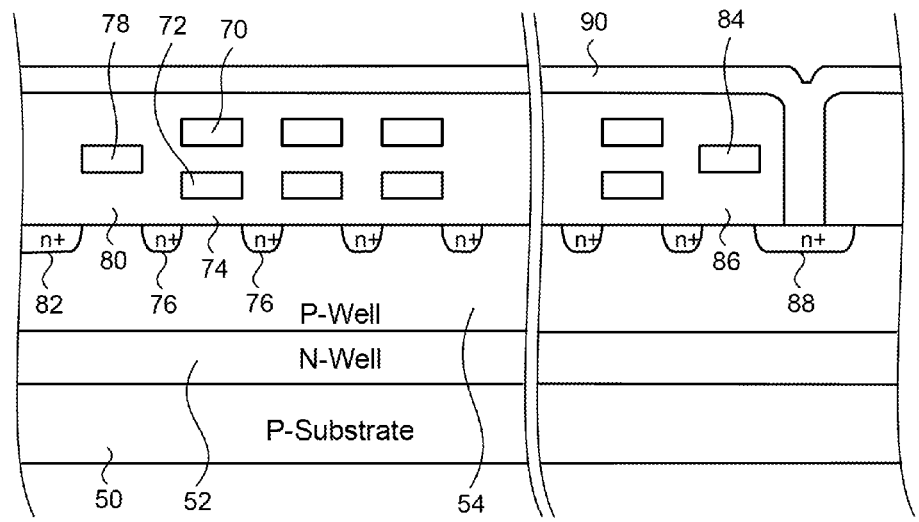
FIG. 4 is a cross section diagram of a NAND cell string of FIG. 3.
Figure 5:
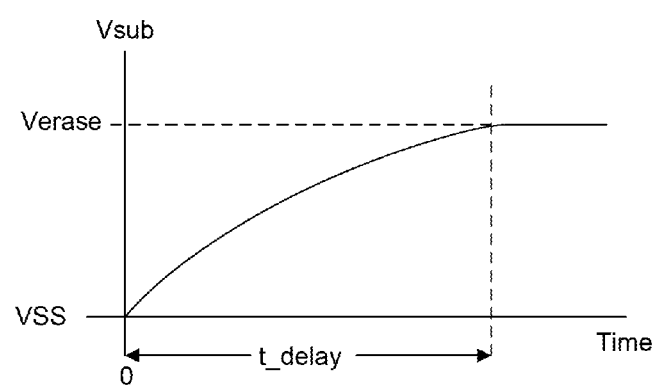
FIG. 5 is a graph plotting the relationship between the substrate voltage Vsub and time.

In both the example NAND flash memory banks of FIGS. 8A, 8B and 9A, 9B, the voltage of the bitlines rises to about Verase-0.6V when the p-type well of the well sector rises to Verase. With reference to FIG. 4 for example, the p-type well 54 and the n+ diffusion region 88 has a p-n junction that is forward biased when Verase is applied. Accordingly, bitline 90 will clamp to about Verase-0.6V, where 0.6V is the forward bias voltage drop across the p-n junction. Each bitline is electrically connected to the NAND cell strings in each memory block of the memory array. Accordingly, this clamped voltage of the bitline is applied to the n+ diffusion regions 88 of all the NAND cell strings of the column, and notably to the n+ diffusion regions 88 of the NAND cell strings in the unselected well sectors. Since the unselected well sectors are biased to VSS, or float near VSS, the bitlines potentially provide a charge leakage path between the selected well sector and one or more unselected well sectors. More specifically, Verase being applied to the selected well sector can be discharged to VSS through the unselected well sector if junction breakdown occurs at the p-n junctions of the n+ diffusion region 88 and the p-type well 54 of each NAND cell string. This can delay the rise of Verase in the selected well sector, or even disrupt the erase process if the selected well sector voltage never fully reaches Verase. With this understanding of the bitline voltage during erase operations, the junction breakdown voltage of the n+ diffusion region 88 is engineered to withstand breakdown when the bitline rises to Verase-0.6V.

Figure 10:
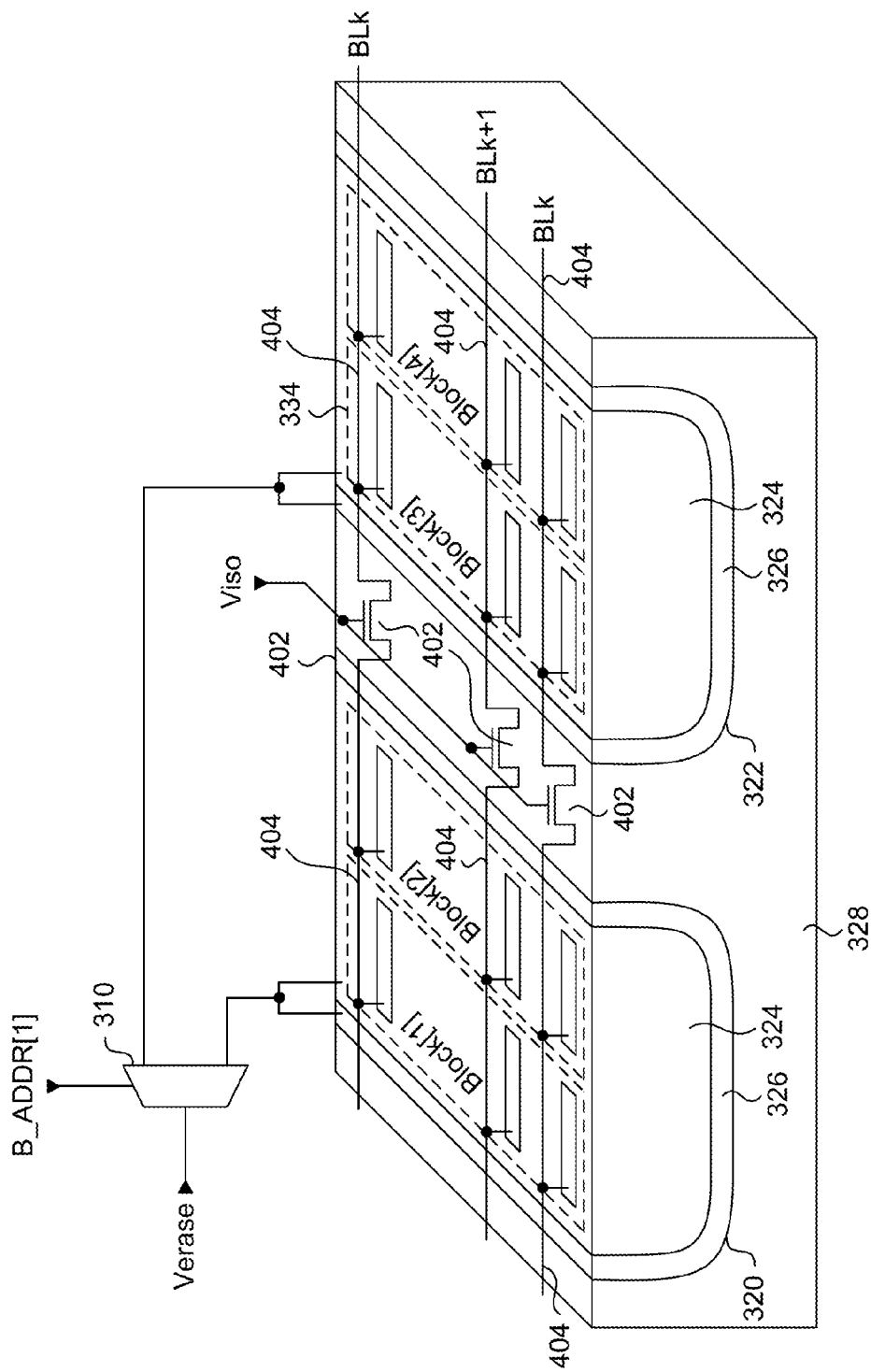
FIG. 10 is the cross-sectional diagram of FIG. 9B including isolation devices formed in-line with the bitlines.

Although junction breakdown engineering is a possible solution to this problem, a simpler solution is to electrically isolate the bitline connected to the selected well sector from the unselected well sectors. According to a present embodiment, since well sectors are spaced from each other due to design rules, an isolation device is included in-line with the bitline between well sectors. FIG. 10 illustrates an example of this embodiment.

FIG. 10 is another example of the memory array 302 shown in FIGS. 9A and 9B. In FIG. 10, memory array 400 has the same elements as those shown in FIG. 9B. In order to isolate the bitlines connected to one well sector from the NAND cell strings of another well sector, isolation devices, such as n-channel transistors 402 are formed in the space between well sectors. The n-channel transistors 402 can be formed as high voltage transistor devices, at the same time other high voltage transistor devices are formed on the memory device. The bitlines electrically connected to the NAND cell strings of one well sector are connected to one terminal of isolation devices 402, while the bitlines electrically connected to the NAND cell strings of an adjacent well sector are connected to the other terminal of isolation devices 402. Therefore, the bitlines connected to the NAND cell strings in one well sector are referred to as bitline segments. In FIG. 10, these bitline segments are indicated by reference numbers 404. If there are more than two well sectors in memory array 400, then there are additional isolation devices 402 connected in-line or in series, with each bitline segment 404. The gate terminals of all the isolation devices 400 receive a bias voltage Viso, which is selected to be at least a voltage level sufficiently high for passing the highest voltage level that is applied to the bitline during read and program operations. The isolation devices are hence enabled during a read or program operation. In otherwords, the gate terminals of all the isolation devices can be overdriven to a level above the supply voltage VDD. There may be devices where overdriving the gate terminals is not necessary, and it is sufficient to drive them to the supply voltage VDD.

For example, if VDD is applied to bitlines during a programming operation for programming a particular logic state to a flash memory cell, then the bias voltage Viso should be at least VDD+Vtn, where Vtn is a threshold voltage of an n-channel transistor. By setting Viso to such a voltage level, a full VDD voltage level is maintained in all bitline segments during programming. During an erase operation for a memory block in a selected well sector, the corresponding bitline segment will rise to about Verase-0.6V. But because the isolation devices 404 have their gates biased to Viso=VDD+Vtn, the other bitline segments are limited to being charged to VDD. Therefore, minimal additional junction breakdown engineering is required since the n+ diffusion region connected to the bitlines is already designed to withstand a VDD voltage level.

In one example of the memory array 400, Viso is statically maintained at the same voltage level during read, program and erase operations. Persons skilled in the art should understand that there are different ways to provide Viso. In an alternate example Viso can be a decoded signal, meaning that Viso is selectively applied to the gates of the isolation devices adjacent to the selected well sector.

Figure 11:
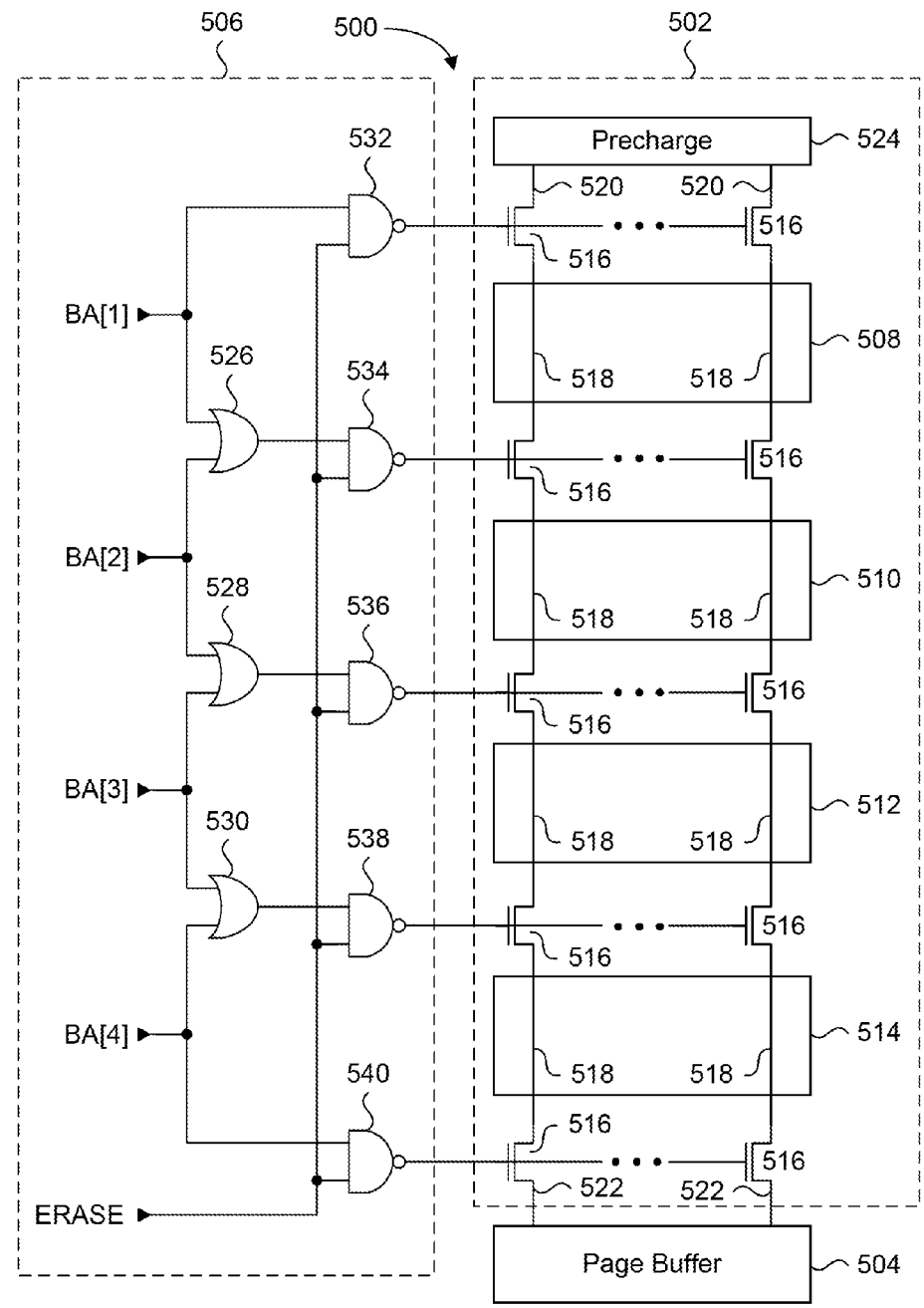
FIG. 11 is a circuit schematic of a memory bank having dynamically controlled isolation devices, according to one example.

FIG. 11 is a circuit schematic of an example of the embodiment of FIG. 10. In FIG. 11, one memory bank has a memory array with dynamically activated isolation devices formed between well sectors for defining bitline segments, and a bitline segment decoder for selectively isolating one bitline segment from the other bitline segments in each column. The row decoder is not shown in order to simplify the schematic, but those skilled in the art will understand that they are necessary for driving the wordlines of the NAND cell strings in each memory block. A memory bank 500 includes a memory array 502, a page buffer 504 and a bitline segment decoder 506. Memory array 502 of the present example includes four well sectors 508, 510, 512 and 514, where each well sector includes exactly one memory block. Accordingly, memory array 502 has the same structure as memory array 202 of FIGS. 8A/8B. Formed between each well sector are isolation devices 516, each being an n-channel transistor for the present example. Bitline segments 518 are connected to the NAND cell strings in each memory block, and are connected to an isolation device at both ends. Bitline tail segments 520 and 522 are bitline segments which are not connected to any NAND cell strings and are connected to one isolation device 516 and some other terminating circuit. For example, bitline tail segments 520 are connected to isolation devices 516 above well sector 508 and to a bitline precharge circuit 524. Bitline tail segments 522 on the other hand are connected to isolation devices 516 below well sector 514 and to page buffer 504. While the present example of FIG. 11 shows each well sector having one memory block formed therein, according to alternate examples each well sector can have multiple memory blocks formed therein, where a bitline segment is commonly connected to the multiple memory blocks residing in the same well sector. The isolation devices 516 driven by NAND logic gate 532 and NAND logic gate 540 are optional, meaning that the bitline segments 518 corresponding to well sectors 508 and 514 can extend to the precharge circuit 524 and the page buffer 504 respectively.

Bitline segment decoder 506 is responsible for disabling, rendering electrically non-conductive, or turning off, the selected isolation devices 516 for isolating a bitline segment 518 corresponding to a selected well sector including the selected memory block to be erased, from all other bitline segments 518. Bitline segment decoder 506 includes OR logic gates 526, 528 and 530, and NAND logic gates 532, 534, 536, 538 and 540. Each of OR logic gates 526, 528 and 530 receives two different well sector selection signals, and more specifically, two well sector selection signals corresponding to adjacent well sectors. Because adjacent well sectors share the same isolation device 516, an OR logic gate is used to disable the isolation devices 516 between two adjacent well sectors when either is selected or addressed for an erase operation. In the example of FIG. 11, the well sector selection signals correspond to decoded block address BA[1:4] because there is exactly one memory block in each well sector. The number of well sector selection signals required by bitline segment decoder 506 depends on the number of well sectors in the memory array of the memory bank. For example, if there were exactly two memory blocks in each well sector of FIG. 11, then there are a total of eight (8) memory blocks. Accordingly, three block address signals are used for individually selecting one of eight memory blocks, but two of the most significant block address signals can be used for generating the well sector selection signals. For example, a modified version of the memory block drive circuit 122 of FIG. 7B can have a three input AND logic gate instead of the 2 input AND logic gate 140 for decoding B_ADDR[1], B_ADDR[2] and B_ADDR[3] to perform a one of eight selection. Accordingly, persons skilled in the art will understand that there would be a total of eight memory block drive circuits, one for each memory block. In the present example, the two most significant block addresses B_ADDR[3] and B_ADDR[2] are decoded using well known logic to provide four well sector selection signals.

NAND logic gates 534, 536 and 538 each have a first input for receiving the output of OR logic gates 526, 528 and 530 respectively. NAND logic gate 532 has a first input for receiving a well sector selection signal directly because the isolation devices 516 above well sector 508 are not shared with another well sector. Similarly, NAND logic gate 540 has a first input for receiving a well sector selection signal directly because the isolation devices 516 below well sector 514 are not shared with another well sector. The second input of all the NAND logic gates receives an erase signal ERASE, and the output of each NAND logic gate drives a set of isolation devices 516 adjacent to at least one well sector. The high logic level output of each NAND logic gate is set such that the isolation devices 516 are driven to a voltage level sufficient to allow the maximum bitline voltage level to pass through it. For example, if the maximum bitline voltage is VDD then the NAND logic gates are supplied with a positive voltage higher than VDD.

According to the present example, signal ERASE is set to the low logic level for a read or program operation, thereby turning on or overdriving all the isolation devices 516. As previously stated all the NAND logic gates can be supplied with a voltage level greater than the VDD supply voltage. Therefore the logic states of the well sector selection signals BA[1:4] are ignored. During an erase operation, signal ERASE is set to the high logic level. Now NAND logic gates 532 and 540 are responsive to the well sector selection signals BA[1:4], and NAND logic gates 534, 536 and 538 are responsive to an output of a corresponding OR logic gate. The NAND logic gates are responsive by driving their outputs to the inactive logic level when their first and second inputs are both at the high logic level. Accordingly, when one well sector selection signal is at the active high logic level, the sets of isolation devices adjacent to the correspondingly selected well sector are turned off. Then the erase voltage Verase is applied to the selected well sector.

For example, if a memory block in well sector 510 is to be erased, then only address BA[2] is driven to the high logic level. Then NAND logic gates 534 and 536 drive their respective outputs to the low logic level, such as VSS, and the isolation devices 516 having their gates electrically coupled to the outputs of NAND logic gates 534 and 536 will turn off. Therefore, the bitline segments 518 of well sector 510 are isolated from the other bitline segments of the other well sectors.

In the example of FIG. 11, bitline segments 518 are selectively disconnected from the other bitline segments in response to decoded block addresses BA[1:4] during an erase operation. In an alternate example, all the isolation devices are globally enabled and disabled in response to the operating mode of the memory device. More specifically, if an erase operation is executed, then all the isolation devices 516 are turned off independently of any address information.

Figure 12:
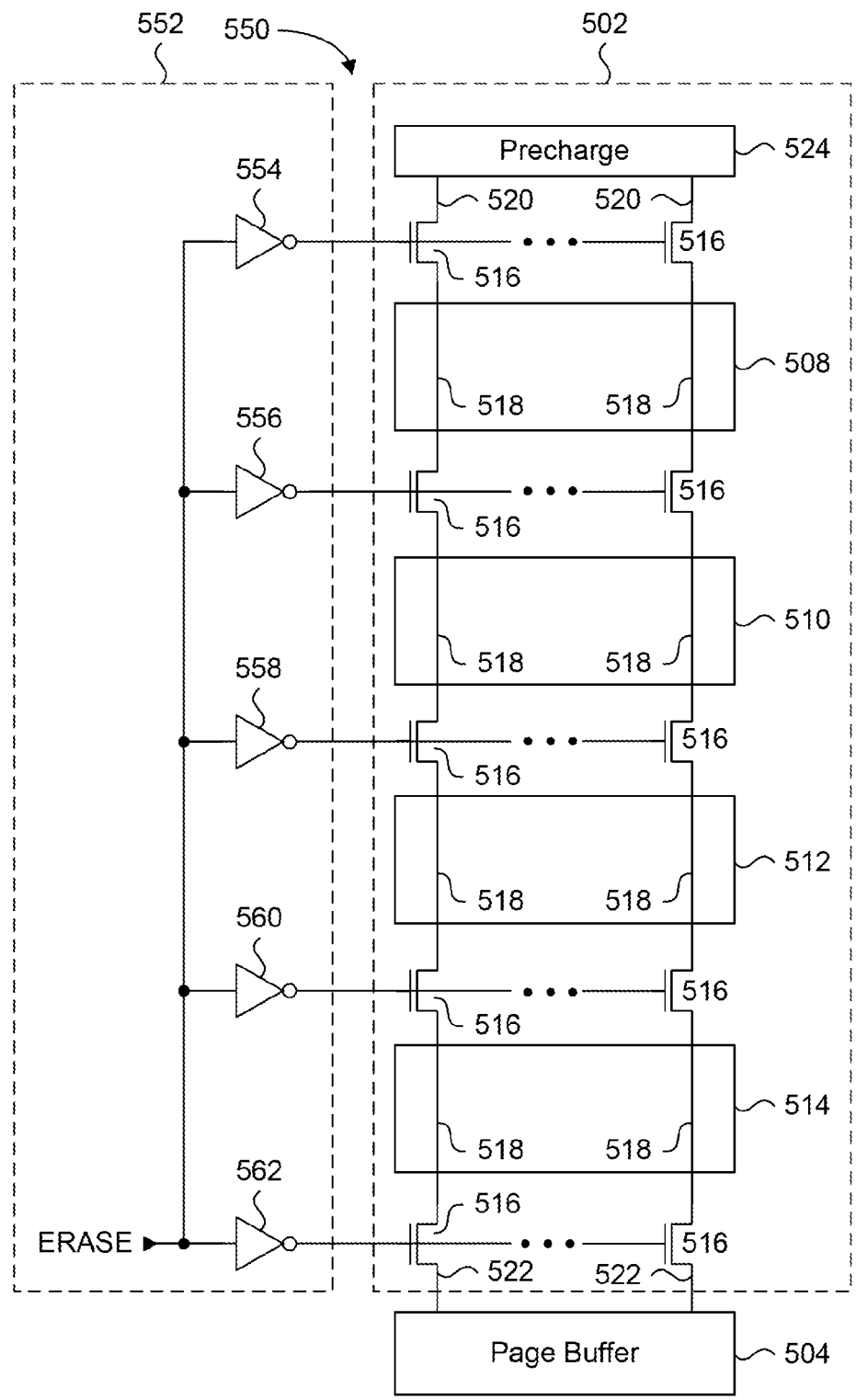
FIG. 12 is a circuit schematic of a memory bank having dynamically controlled isolation devices, according to another example.

FIG. 12 is a circuit schematic of one memory bank having a memory array with dynamically activated isolation devices formed between well sectors, according to an alternate example of the embodiment of FIG. 10. In FIG. 12, memory bank 550 includes the same memory array 502 shown in FIG. 11, but now bitline segment decoder 506 is replaced with a simple segment decoupling logic 552. Segment decoupling logic 552 includes inverters 554, 556, 558, 560 and 562, each of which receives the erase signal ERASE in parallel, and drives a respective set of isolation devices 516. In the present example, the inverters are provided with a supply voltage VDD or a voltage level greater than VDD to overdrive the isolation devices 516 during non-erase operations. In an erase operation, signal ERASE is driven to the high logic level, and all the inverters drive the gates of the isolation devices 516 to VSS. All the isolation devices 516 turn off, resulting in all the bitline segments 518 being isolated from each other, and Verase is applied to the selected well sector that includes the memory block to be erased. In a program or read operation, ERASE is at the low logic level, and the isolation devices have their gates driven to a voltage level of at least VDD.

In both the examples of FIGS. 11 and 12, ERASE is at the inactive low logic level during a read or program operation to ensure that all the isolation devices 516 are at least turned on, or overdriven. Unfortunately, a known issue affecting sensing time is bitline capacitance. Those skilled in the art understand that as the bitline length increases, its capacitance increases as well. Because the current through a conducting flash memory cell is small, this current is difficult to sense when the bitline capacitance is high. Therefore, the isolation devices shown in FIGS. 11 and 12 can be used in an alternate embodiment of the invention to reduce bitline capacitance to shorten sensing time.

Figure 13:
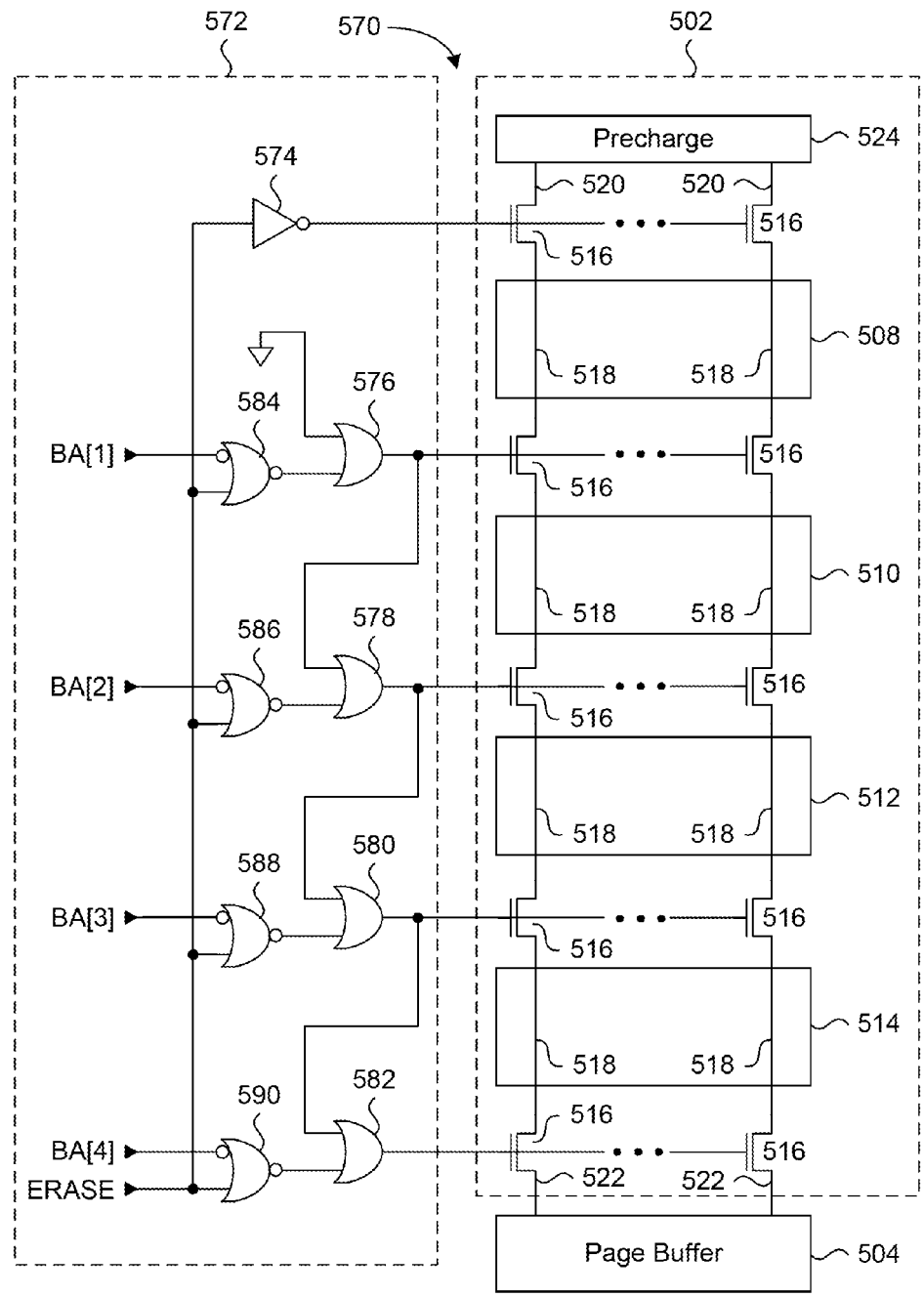
FIG. 13 is a circuit schematic of a memory bank having dynamically controlled isolation devices, according to yet another example; and, FIG. 14 is a flow chart showing a method of erasing a memory block, according an embodiment of the present invention.

FIG. 13 is a circuit schematic of an alternate memory bank 570 according to an example of the embodiment for reducing bitline capacitance to shorten sensing time. Memory array 502 is the same as the one shown in FIG. 11, but an alternate bitline segment decoder 572 according to an example of the present embodiment is illustrated. Bitline segment decoder 572 turns off all the isolation devices 516 in memory array 502 during an erase operation, and selectively turns off specific isolation devices 516 during a read operation. In FIG. 13, bitline segment decoder 572 includes an inverter 574 having its output for providing an isolation drive signal coupled to a respective set of isolation devices 516 between the bitline precharge circuit 524 and well sector 508, and OR logic gates 576, 578, 580 and 582 each having an output for providing an isolation drive signal coupled to respective sets of isolation devices 516. A first input of OR logic gates 576, 578, 580 and 582 is coupled to the outputs of NOR logic gates 584, 586, 588 and 590 respectively. Inverter 574 and each pairing of a NOR logic gate and OR logic gate are referred to as an isolation device driver, having outputs for driving respective isolation devices. A second input of OR logic gates 578, 580 and 582 receives the output of another isolation device driver, while the second input of OR logic gate 576 is grounded. Each isolation device driver provides its isolation drive signal for one set of isolation devices 516 to one isolation device driver that provides its isolation drive signal to a second set of isolation devices 516, where the second set of isolation devices is located between the first set of isolation devices and the page buffer 504. A first input of OR logic gates 584, 586, 588 and 590 receives the erase signal ERASE. A second input of NOR logic gates 584, 586, 588 and 590 is an inverted input, and receives well sector selection signals BA[1], BA[2], BA[3] and BA[4] respectively.

As previously mentioned for the example arrangement of memory array 502, each well sector includes one memory block, hence decoded block addresses BA[1:4] can be used as the well sector selection signals. The operation of bitline segment decoder 572 is straightforward during an erase operation. Signal ERASE is set to the active high logic level, thereby causing each NOR logic gate to provide a low logic level output which is passed by each OR logic gate as the isolation drive signal to all the isolation devices 516. Therefore all the isolation devices 516 are turned off while ERASE is at the high logic level, and Verase can be applied to the selected well sector.

During a read operation, only the isolation devices 516 located between the well sector containing the selected memory block and the page buffer 504 are turned on, or overdriven. All other isolation devices are turned off to minimize the bitline capacitance seen by the selected NAND cell strings of the selected memory block. For example, when a memory block in well sector 512 is selected for a read operation, isolation devices 516 between well sectors 512 and 514 are turned on, as are the isolation devices 516 between well sector 514 and page buffer 504. Therefore during a read operation for a selected memory block, only the bitline segments 518 corresponding to the selected well sector including the selected memory block, and the bitline segments 518 corresponding to all the other intervening well sectors between the selected well sector and the page buffer are electrically coupled to each other. In the example of FIG. 13, each OR logic gate of the isolation device driver is an address overrider circuit. It is noted that the isolation device driver having inverter 574 does not include a NOR logic gate and an OR logic gate, since there are no further well sectors between the isolation devices 516 it controls and bitline precharge circuit 524. The address overrider circuit allows for an isolation device driver activated by a well sector selection signal to enable or activate the next set of isolation devices 516 proximate to the page buffer 504.

In an example read operation the selected memory block resides in well sector 510, thus BA[2] is driven to the high logic level and ERASE is at the low logic level. With ERASE at the low logic level, inverter 574 turns on or overdrives its isolation devices. NOR gate 584 provides a low logic level output since BA[1] is at the low logic level, which is passed by OR gate 576 to its respective set of isolation devices 516. NOR gate 586 provides a high logic level output to OR gate 578, which also receives the low logic level output from OR gate 576. Accordingly, the isolation devices 516 between well sectors 510 and 512 are turned on or overdriven. With BA[3] at the low logic level, NOR gate 588 drives its output to the low logic level. However, the high logic level output of OR gate 578 is received by OR gate 580. Therefore the output of NOR gate 588 is overridden. Similarly, the output or NOR gate 590 is overridden by OR gate 582, thus the isolation devices 516 between well sectors 512 and 514 and page buffer 504 are turned on.

With the reading scheme shown in FIG. 13, the worst case read situation occurs when the selected memory block resides within well sector 508, which is the furthest from page buffer 504. On the other hand, the best case read situation occurs when the selected memory block resides within well sector 514, which is the closest to page buffer 504. Therefore, the sense timing and data output transfer timing can be adjusted based on the selected well sector that includes the selected memory block to be read. In one example application, a specific number of the memory blocks formed in well sectors proximate to the page buffer 504 can be designated as high speed memory blocks. The remaining memory blocks residing in the well sectors further from the page buffer 504 can be designated as regular speed memory blocks. While in use with an external system, data can be selectively stored in either high speed or regular speed memory blocks for high speed or regular speed read operations.

Figure 14:
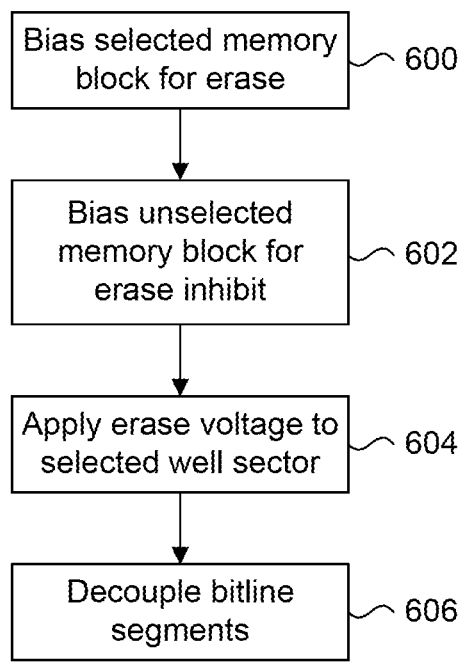

FIG. 14 is a flow chart summarizing the method by which a selected memory block is erased, in accordance with the previously described embodiments of the invention. The following method is applicable to a memory array having any number of well sectors, where each well sector includes at least one memory bank. Starting at step 600 a selected memory block is biased for erasing, which is done by setting the wordlines, SSL and GSL to the appropriate erase bias conditions. Table 2 illustrates example erase bias conditions for the memory block to be erased. If each well sector includes at least two memory blocks, then there is an unselected memory block in the same well sector as the selected memory block to be erased. Therefore at step 602, the unselected memory block in the same well sector as the selected memory block is biased to inhibit erase of its memory cells. Once again, Table 2 illustrates example erase inhibit bias conditions for the wordlines, SSL and GSL. If on the other hand each well sector includes exactly one memory block, then step 602 is skipped. Proceeding to step 604, the erase voltage is applied to the well sector containing the selected memory block. Following at step 606, the bitline segments of the selected well sector are decoupled from the other bitline segments either at the same time or just after Verase is applied to the selected well sector. It is noted that it is sufficient to decouple the bitline segment of the selected well sector from the bitline segments of adjacent well sectors. This decoupling is either dynamic decoupling or static decoupling. Static decoupling occurs when the isolation devices are statically biased to Viso, and the bitline segments of the selected well sector self-decouple from the other bitline segments as its voltage rises past Viso. Dynamic decoupling occurs by actively turning off the isolation devices either globally in response to a single control signal, such as ERASE, or in response to a well sector selection signal. If dynamic decoupling is used, then the isolation devices can be turned off prior to application of Verase to the selected well sector.

Figure 1A:
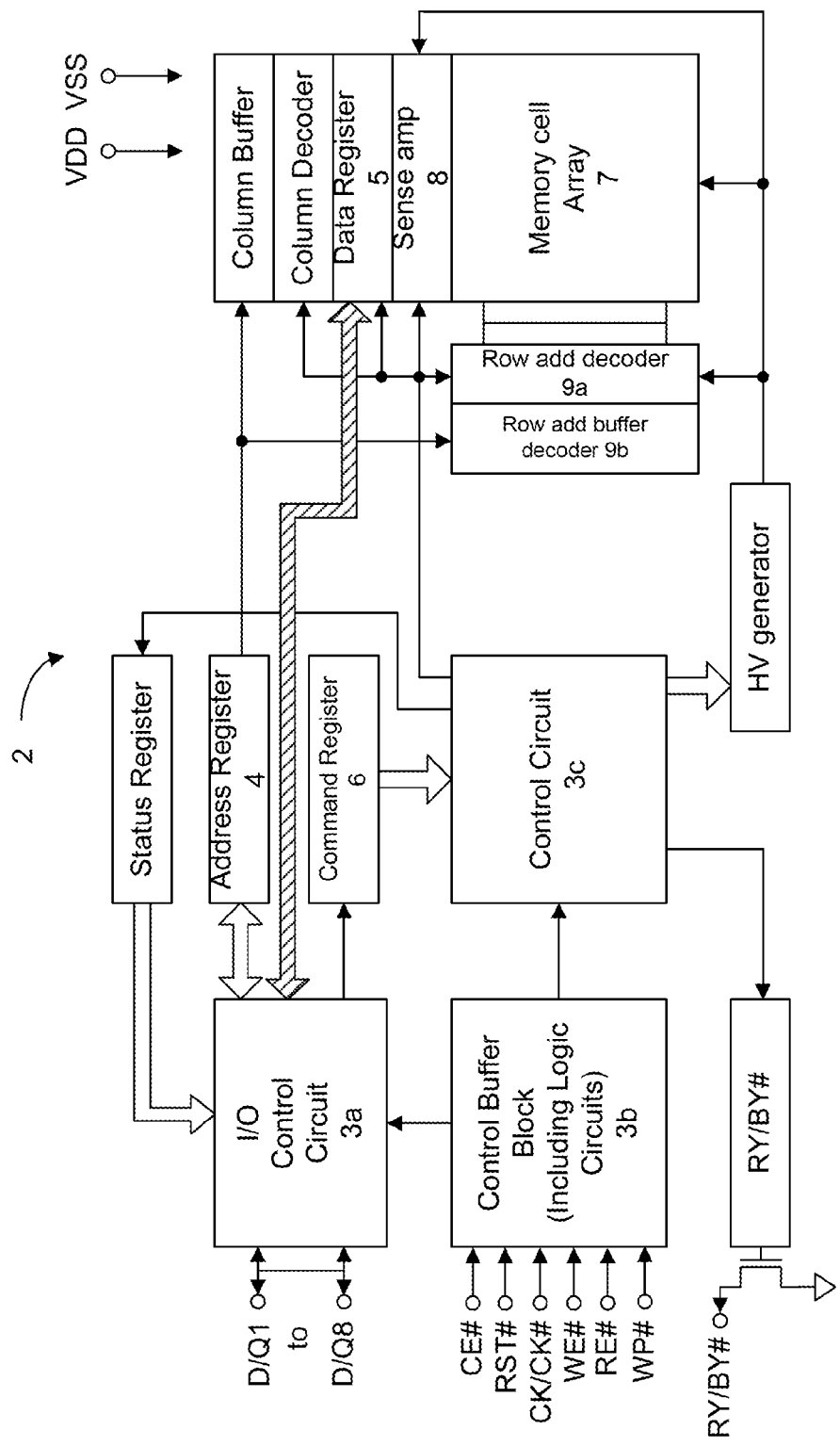
FIG. 1A is a block diagram of a flash memory device.
Figure 1B:
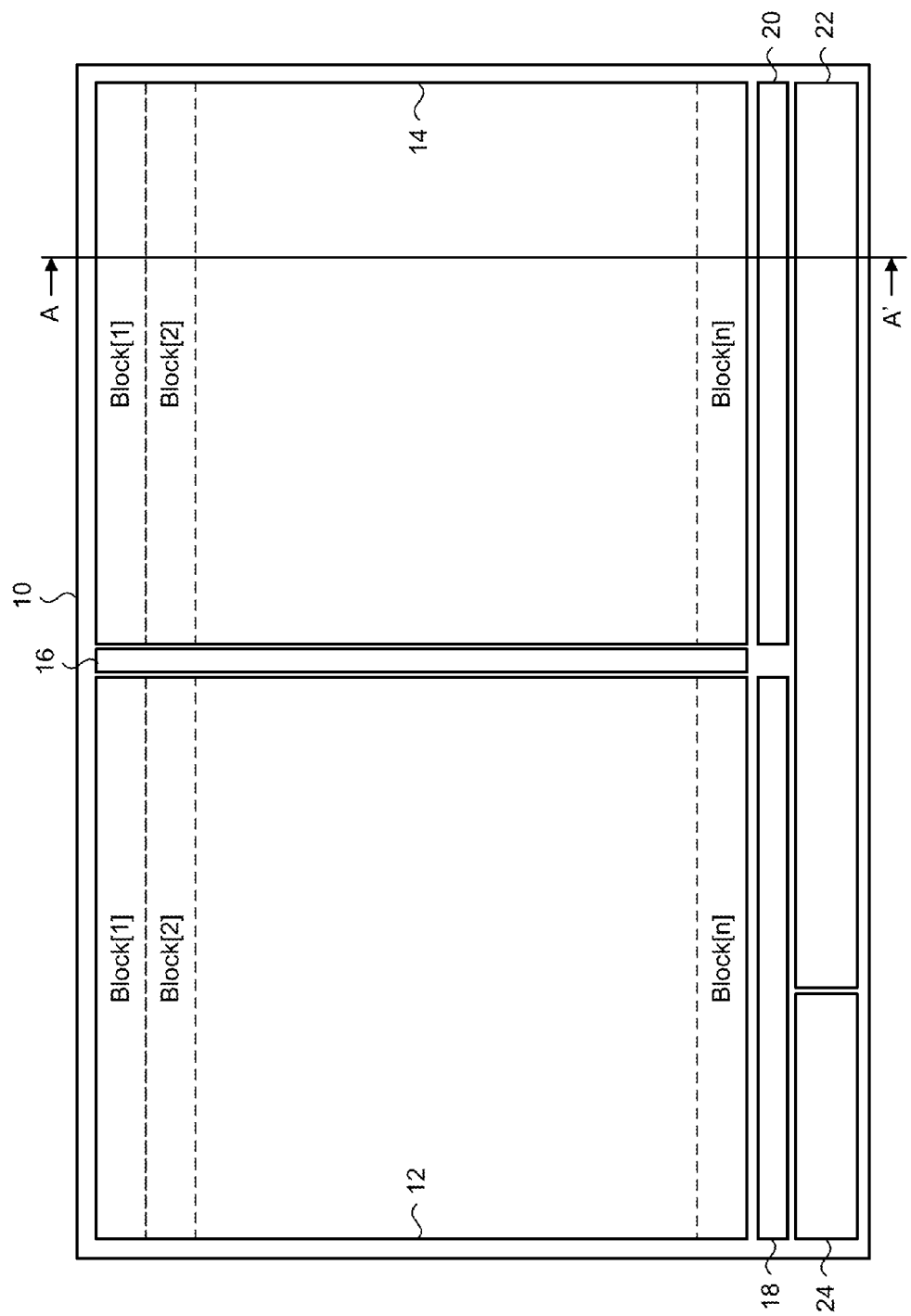
FIG. 1B is a floor plan layout a prior art flash memory device.

The presently shown memory bank embodiments and examples of the invention reduce power consumption while improving the speed at which a memory block is erased by forming well sectors that can be selectively biased to the required erase voltage. Each well sector has at least one memory block formed therein, and thus has a lower capacitance than prior art NAND flash memory arrays that have all memory blocks formed in one large well. All the previously described memory bank embodiments and examples can be used in the NAND memory device of FIG. 1A, or the NAND memory device chip of FIG. 1B.

As shown by the previous embodiments and examples, a memory array of a memory bank will have reduced well capacitance by forming at least two well sectors, each well sector having at least one memory block formed therein. The reduced well capacitance allows for higher erase speeds for the selected memory block than prior art single well memory arrays. If erase performance is a non-critical specification for the NAND flash memory device having multiple well sectors in its memory bank, the charge pump size can be reduced while maintaining erase speeds similar to that of prior art NAND flash memory devices. In the embodiments and examples described above, the device elements are connected to each other as shown in the figures, for the sake of simplicity. In practical applications of the present invention to an apparatus, devices, elements, circuits, etc. may be connected directly to each other. As well, devices, elements, circuits etc. may be connected indirectly to each other through other devices, elements, circuits, etc., necessary for operation of the apparatus. Thus, in actual configuration, the circuit elements and devices are directly or indirectly coupled with, or connected to, each other.

In the preceding description, for purposes of explanation, numerous details and examples are set forth in order to provide a thorough understanding of the embodiments of the invention. However, it will be apparent to one skilled in the art that these specific details are not required in order to practice the invention. In other instances, well-known electrical structures and circuits are shown in block diagram form in order not to obscure the invention. For example, specific details are not provided as to whether the embodiments of the invention described herein are implemented as a software routine, hardware circuit, firmware, or a combination thereof.

The above-described embodiments of the invention are intended to be examples only. Alterations, modifications and variations can be effected to the particular embodiments by those of skill in the art without departing from the scope of the invention, which is defined solely by the claims appended hereto.

What is claimed is:

1. A NAND Flash memory comprising:
an internal voltage generator configured to provide an erase voltage; and
a plurality of memory planes coupled to the internal voltage generator, each memory plane comprising:
a plurality of memory blocks, each memory block having a plurality of NAND cell strings and a plurality of wordlines, each wordline coupled to corresponding gates of the NAND cell strings;
a plurality of well sectors, each well sector having one or more memory blocks, the erase voltage being applied to a selected well sector during a block erase operation;
a plurality of bitlines, each bitline coupled to a corresponding NAND cell string at each memory block; and
a page buffer coupled to the plurality of memory blocks via the plurality of bitlines.

2. The NAND flash memory device of claim 1 further comprising a selector configured to receive a block address and to selectively provide the erase voltage to the corresponding memory block according to the block address.

3. The NAND flash memory device of claim 2, wherein each of the plurality of well sectors comprises a n-type isolation well and a p-type well.

4. The NAND flash memory device of claim 3, wherein the p-type well is formed within the n-type isolation well.

5. The NAND flash memory device of claim 3, wherein the erase voltage is applied to the selected well sector, and a ground voltage is applied to an unselected well sector.

6. The NAND flash memory device of claim 5, wherein the ground voltage is applied to the wordlines of a selected memory block of the selected well sector while the wordlines of unselected memory blocks of the selected well sector are self-boosted to a voltage level less than the erase voltage.

7. The NAND flash memory device of claim 1, wherein each bitline is divided into a plurality of bitline segments by an isolation transistor located between the well sectors.

8. The NAND Flash memory of claim 7, wherein the isolation transistor has a gate terminal biased to a voltage greater than a supply voltage VDD during a program operation, a read operation, and the block erase operation, and
wherein the isolation transistor is electrically non-conductive to isolate the bitline segments during the block erase operation.

* * * * *